United States Patent
Kobayashi et al.

(10) Patent No.: US 9,091,933 B2
(45) Date of Patent: Jul. 28, 2015

(54) NEGATIVE PATTERN FORMING PROCESS

(71) Applicant: SHIN-ETSU CHEMICAL CO., LTD., Tokyo (JP)

(72) Inventors: Tomohiro Kobayashi, Joetsu (JP); Kazuhiro Katayama, Joetsu (JP); Jun Hatakeyama, Joetsu (JP); Kenji Funatsu, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 38 days.

(21) Appl. No.: 13/679,024

(22) Filed: Nov. 16, 2012

(65) Prior Publication Data
US 2013/0130183 A1 May 23, 2013

(30) Foreign Application Priority Data
Nov. 17, 2011 (JP) ................................. 2011-251229

(51) Int. Cl.
| | |
|---|---|
| G03F 7/38 | (2006.01) |
| G03F 7/004 | (2006.01) |
| C08F 220/34 | (2006.01) |
| C08F 220/36 | (2006.01) |
| C08F 226/06 | (2006.01) |
| C08F 226/10 | (2006.01) |
| C08F 228/02 | (2006.01) |
| C08F 228/06 | (2006.01) |
| G03F 7/038 | (2006.01) |
| G03F 7/039 | (2006.01) |
| G03F 7/20 | (2006.01) |
| G03F 7/32 | (2006.01) |
| C08F 220/38 | (2006.01) |

(52) U.S. Cl.
CPC ............... *G03F 7/38* (2013.01); *C08F 220/34* (2013.01); *C08F 220/36* (2013.01); *C08F 226/06* (2013.01); *C08F 226/10* (2013.01); *C08F 228/02* (2013.01); *C08F 228/06* (2013.01); *G03F 7/004* (2013.01); *G03F 7/0382* (2013.01); *G03F 7/0397* (2013.01); *G03F 7/2041* (2013.01); *G03F 7/325* (2013.01); *C08F 2220/343* (2013.01); *C08F 2220/365* (2013.01); *C08F 2220/382* (2013.01); *C08F 2220/385* (2013.01); *C08F 2220/387* (2013.01)

(58) Field of Classification Search
CPC ....... G03F 7/0382; G03F 7/38; C08F 220/34; C08F 220/36; C08F 2220/343; C08F 2220/365; C08F 2220/382; C08F 2220/385; C08F 2220/387; C08F 226/06; C08F 226/10; C08F 228/02; C08F 228/06
USPC ....................... 430/270.1, 325, 330, 910, 905; 526/259, 260, 263, 265
See application file for complete search history.

(56) References Cited

U.S. PATENT DOCUMENTS

| | | | |
|---|---|---|---|
| 6,180,316 B1* | 1/2001 | Kajita et al. ............... | 430/270.1 |
| 6,949,325 B2* | 9/2005 | Li et al. ..................... | 430/270.1 |
| 7,537,880 B2 | 5/2009 | Harada et al. | |
| 7,759,047 B2 | 7/2010 | Hatakeyama et al. | |
| 7,771,913 B2 | 8/2010 | Kaneko et al. | |
| 7,781,142 B2* | 8/2010 | Chiba et al. ................ | 430/270.1 |
| 8,017,304 B2 | 9/2011 | Tarutani et al. | |
| 8,034,547 B2 | 10/2011 | Tsubaki et al. | |
| 8,614,050 B2* | 12/2013 | Bae et al. ................... | 430/270.1 |
| 2002/0004570 A1* | 1/2002 | Zampini et al. ............. | 526/257 |
| 2007/0003867 A1 | 1/2007 | Hatakeyama et al. | |
| 2007/0218401 A1* | 9/2007 | Ando et al. ................ | 430/270.1 |
| 2008/0090172 A1 | 4/2008 | Hatakeyama et al. | |
| 2008/0153030 A1 | 6/2008 | Kobayashi et al. | |
| 2009/0317739 A1* | 12/2009 | Thiyagarajan et al. .... | 430/270.1 |
| 2010/0248147 A1* | 9/2010 | Chen et al. ................ | 430/286.1 |
| 2011/0177462 A1 | 7/2011 | Hatakeyama et al. | |
| 2011/0236826 A1* | 9/2011 | Hatakeyama et al. ..... | 430/270.1 |
| 2013/0011783 A1* | 1/2013 | Ober et al. ................ | 430/270.1 |
| 2013/0040096 A1 | 2/2013 | Iwato et al. | |

FOREIGN PATENT DOCUMENTS

| | | | |
|---|---|---|---|
| JP | 2000-336121 A | 12/2000 | |
| JP | 3790649 B2 | 6/2006 | |
| JP | 2007-025634 A | 2/2007 | |
| JP | 2007-297590 A | 11/2007 | |
| JP | 2007-316448 A | 12/2007 | |
| JP | 2008-003569 A | 1/2008 | |
| JP | 2008-111103 A | 5/2008 | |
| JP | 2008-122932 A | 5/2008 | |

(Continued)

OTHER PUBLICATIONS

Nakamura, Hiroko et al., "Contact Hole Formation by Multiple Exposure Technique in Ultra-low k1 Lithography", Proc. SPIE, 2004, vol. 5377, p. 255-263.
Nakao, Shuji et al., "0.12mm Hole Pattern Formation by KrF Lithography for Giga Bit DRAM", IEEE IEDM Tech Digest, 1996, p. 61-64.
Truffert, V. et al., "Ultimate contact hole resolution using immersion lithography with line/space imaging", Proc. SPIE, 2009, vol. 7274, p. 72740N-1-72740N-12.

(Continued)

*Primary Examiner* — John Chu
(74) *Attorney, Agent, or Firm* — Westerman, Hattori, Daniels & Adrian, LLP

(57) ABSTRACT

A negative pattern is formed by applying a resist composition comprising (A) a polymer comprising recurring units (a1) having a carboxyl group protected with an acid labile group and recurring units (a2) having an amino group, amide bond, carbamate bond or nitrogen-containing heterocycle, (B) a photoacid generator, and (C) an organic solvent onto a substrate, prebaking, exposing, baking, and selectively dissolving an unexposed region of the resist film in an organic solvent-based developer.

15 Claims, 10 Drawing Sheets

(56) References Cited

FOREIGN PATENT DOCUMENTS

| | | |
|---|---|---|
| JP | 2008-158339 A | 7/2008 |
| JP | 2008-281974 A | 11/2008 |
| JP | 2008-281975 A | 11/2008 |
| JP | 2008-281980 A | 11/2008 |
| JP | 2009-025707 A | 2/2009 |
| JP | 2009-025723 A | 2/2009 |
| JP | 2009-053657 A | 3/2009 |
| JP | 2010-119755 A | 6/2010 |
| JP | 2010-214563 A | 9/2010 |
| JP | 2011-170316 A | 9/2011 |
| JP | 2011-227463 A | 11/2011 |

OTHER PUBLICATIONS

Owe-Yang, D.C. et al., "Double exposure for the contact layer of the 65-nm node", Proc. SPIE, 2005, vol. 5753, p. 171-180.

Japanese Office Action dated Sep. 16, 2014, issued in corresponding Japanese Patent Application No. 2011-251229 (4 pages).

* cited by examiner

NEGATIVE PATTERN FORMING PROCESS

CROSS-REFERENCE TO RELATED APPLICATION

This non-provisional application claims priority under 35 U.S.C. §119(a) on Patent Application No. 2011-251229 filed in Japan on Nov. 17, 2011, the entire contents of which are hereby incorporated by reference.

TECHNICAL FIELD

This invention relates to a pattern forming process involving application of a specific resist composition, exposure of the resist film, heating to induce deprotection reaction under the catalysis of an acid generated by a photoacid generator, and development in an organic solvent to dissolve the unexposed region, but not the exposed region of the resist film to form a negative tone pattern.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized edge roughness of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. With the hole shrinking method, the hole size can be shrunk, but the pitch cannot be narrowed.

It is then proposed in Non-Patent Document 1 that a pattern of X-direction lines is formed in a positive resist film using dipole illumination, the resist pattern is cured, another resist material is coated thereon, and a pattern of Y-direction lines is formed in the other resist film using dipole illumination, leaving a grid line pattern, spaces of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in Non-Patent Document 2 to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art.

Non-Patent Document 3 reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$-RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes.

The organic solvent development to form a negative pattern is a traditional technique. A resist composition comprising cyclized rubber is developed using an alkene such as xylene as the developer. An early chemically amplified resist composition comprising poly(tert-butoxycarbonyloxy-styrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 6.

However, the negative development in organic solvent is generally low in dissolution contrast, as compared with the positive development in alkaline aqueous solution. Specifically, in the case of alkaline developer, the alkali dissolution rate differs more than 1,000 times between unexposed and exposed regions, whereas the difference is only about 10 times in the case of organic solvent development. In the case of negative development, a shortage of dissolution contrast leads to substantial insolubilization of the resist film subsurface layer, which tends to cause a trench or hole pattern to be closed, inviting a reduction of depth of focus (DOF).

CITATION LIST

Patent Document 1: JP-A 2008-281974
Patent Document 2: JP-A 2008-281975
Patent Document 3: JP-A 2008-281980
Patent Document 4: JP-A 2009-053657
Patent Document 5: JP-A 2009-025707
Patent Document 6: JP-A 2009-025723
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

An object of the invention is to provide a negative pattern forming process involving coating a resist composition designed to prevent surface insolubilization and developing the resist film in an organic solvent to form a trench or hole pattern at a wide DOF.

The inventors have found that a resist composition comprising a polymer of specific structure, a photoacid generator, and an organic solvent exhibits a high resolution and good pattern profile upon organic solvent development, and forms trench and hole patterns at a wide DOF.

In one aspect, the invention provides a pattern forming process comprising the steps of applying a resist composition onto a substrate, prebaking the composition to form a resist film, exposing the resist film to high-energy radiation, baking, and selectively dissolving an unexposed region of the resist film in an organic solvent-based developer to form a negative pattern. The resist composition is defined as comprising (A) a polymer comprising recurring units (a1) having a carboxyl group protected with an acid labile group and recurring units (a2) having at least one structure selected from the group consisting of amino group, amide bond, carbamate bond, and nitrogen-containing heterocycle, (B) a photoacid generator, and (C) an organic solvent, Preferably in polymer (A), the recurring units (a1) having a carboxyl group protected with an acid labile group have the general formula (1):

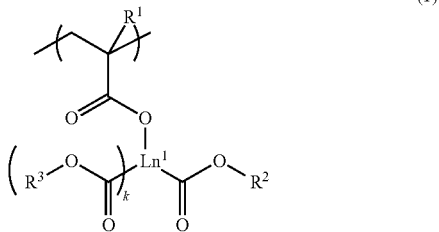

(1)

wherein $R^2$ is each independently hydrogen or methyl, $R^2$ and $R^3$ each are an acid labile group, $k^1$ is 0 or 1, $Ln^1$ is a single bond or a divalent, straight, branched or cyclic $C_1$-$C_{12}$ hydrocarbon group which may contain a heteroatom in case of $k^1$=0, and $Ln^1$ is a trivalent, straight, branched or cyclic $C_1$-$C_{12}$ hydrocarbon group which may contain a heteroatom in case of $k^1$=1.

Preferably, either one or both of acid labile groups $R^2$ and $R^3$ in formula (1) have the general formula (2):

(2)

wherein the broken line denotes a valence bond, $R^4$ is a straight, branched or cyclic $C_1$-$C_6$ alkyl group, and n is 0 or 1.

Also preferably in polymer (A), the recurring units (a2) having at least one structure selected from the group consisting of amino group, amide bond, carbamate bond, and nitrogen-containing heterocycle have the general formula (3):

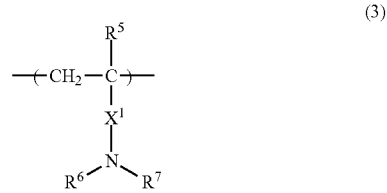

(3)

wherein $R^5$ is hydrogen or methyl, $X^1$ is a single bond or a divalent, straight, branched or cyclic $C_1$-$C_{15}$ hydrocarbon group which may contain an oxygen atom, $R^6$ and $R^7$ are each independently hydrogen or a monovalent, straight, branched or cyclic $C_1$-$C_{15}$ hydrocarbon group which may contain a heteroatom and in which one or more hydrogen atoms may be substituted by fluorine atoms, or $R^6$ and $R^7$ may bond together to form a ring with the nitrogen atom to which they are attached, or either one or both of $R^6$ and $R^7$ may bond with $X^1$ to form a ring with the nitrogen atom to which they are attached.

Also preferably in polymer (A), the recurring units (a2) having at least one structure selected from the group consisting of amino group, amide bond, carbamate bond, and nitrogen-containing heterocycle have the general formula (4):

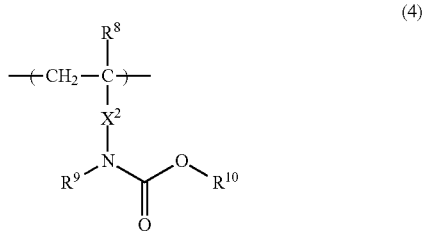

(4)

wherein $R^8$ is hydrogen or methyl, $X^2$ is a single bond or a divalent, straight, branched or cyclic $C_1$-$C_{15}$ hydrocarbon group which may contain an oxygen atom, $R^9$ is hydrogen or a monovalent, straight, branched or cyclic $C_1$-$C_{15}$ hydrocarbon group which may contain a heteroatom and in which one or more hydrogen atoms may be substituted by fluorine atoms, or $R^9$ may bond with $X^2$ to form a ring with the nitrogen atom to which they are attached, and $R^{10}$ is a monovalent $C_3$-$C_{15}$ hydrocarbon group which may contain a heteroatom.

The polymer (A) may further comprise recurring units having a polar functional group selected from the group consisting of hydroxyl, carboxyl, cyano, carbonyl, ether, ester, carbonic acid ester, and sulfonic acid ester, as an adhesive group.

Typically, the developer comprises at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. The at least one organic solvent is present in a total amount of at least 60% by weight of the developer.

Preferably, the step of exposing the resist film to high-energy radiation includes ArF excimer laser immersion lithography of 193 nm wavelength or EUV lithography of 13.5 nm wavelength.

ADVANTAGEOUS EFFECTS OF INVENTION

When the resist composition comprising a polymer of specific structure, a PAG and an organic solvent is processed via organic solvent negative development, a fine trench or hole pattern can be formed at a wide DOF while preventing formation of a substantially insoluble subsurface layer.

BRIEF DESCRIPTION OF DRAWINGS

FIG. 1 is a cross-sectional view of a patterning process according one embodiment of the invention.

DESCRIPTION OF EMBODIMENTS

Figure 1A:
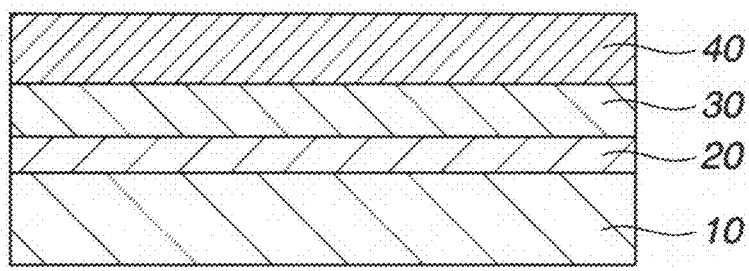
FIG. 1A shows a photoresist film disposed on a substrate.

The terms "a" and an herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$—$C_m$) means a group containing from n to m carbon atoms per group. As used herein, the term "film" is used interchangeably with "coating" or "layer." The term "processable layer" is interchangeable with patternable layer and refers to a layer that can be processed such as by etching to form a pattern therein.

It is understood that for many structures represented by chemical formulae, there can exist enantiomers and diastereomers. Unless otherwise stated, a single plane or steric formula collectively represents all such stereoisomers. The stereoisomers may be used alone or in admixture.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator Briefly stated, the process of the invention uses a resist composition comprising (A) a polymer comprising recurring units (a1) having a carboxyl group protected with an acid labile group and recurring units (a2) having at least one structure selected from the group consisting of amino group, amide bond, carbamate bond, and nitrogen-containing heterocycle, (B) a photoacid generator, and (C) an organic solvent.

In polymer (A), the recurring unit (a1) having a carboxyl group protected with an acid labile group is not particularly limited as long as the unit has one or more structure having a protected carboxyl group wherein the protective group may be decomposed under the action of an acid to regenerate a carboxyl group. Preferably the unit (a1) has the structure of the general formula (1).

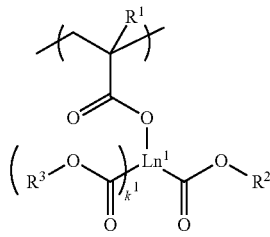

(1)

Herein $R^1$ is each independently hydrogen or methyl, $R^2$ and $R^3$ each are an acid labile group, and $k^1$ is 0 or 1. $Ln^1$ is a single bond or a divalent, straight, branched or cyclic $C_1$-$C_{12}$ hydrocarbon group which may contain a heteroatom in case of $k^1$=0, and $Ln^1$ is a trivalent, straight, branched or cyclic $C_1$-$C_{12}$ hydrocarbon group which may contain a heteroatom in case of $k^1$=1.

Illustrative, non-limiting examples of the recurring unit having formula (1) are given below.

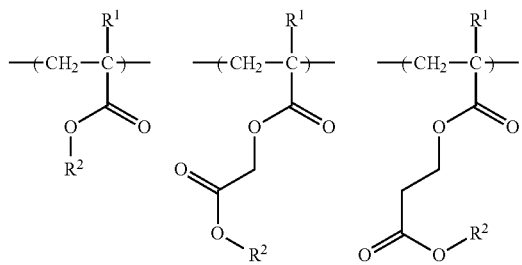

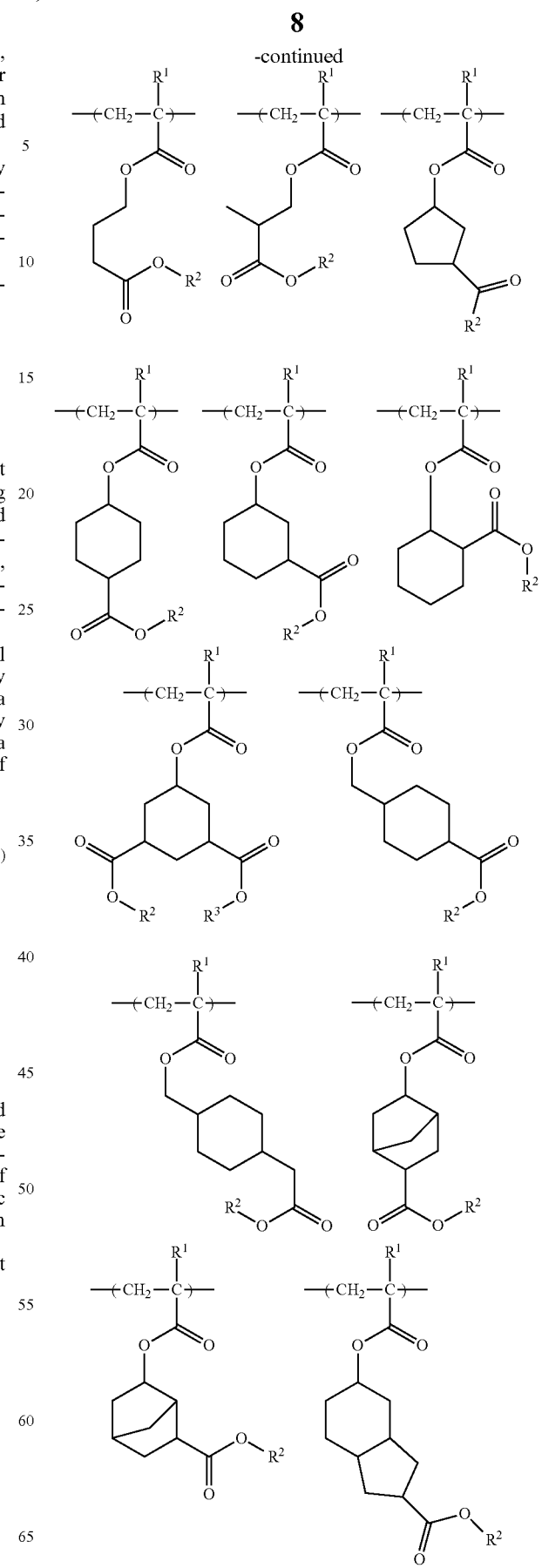

-continued

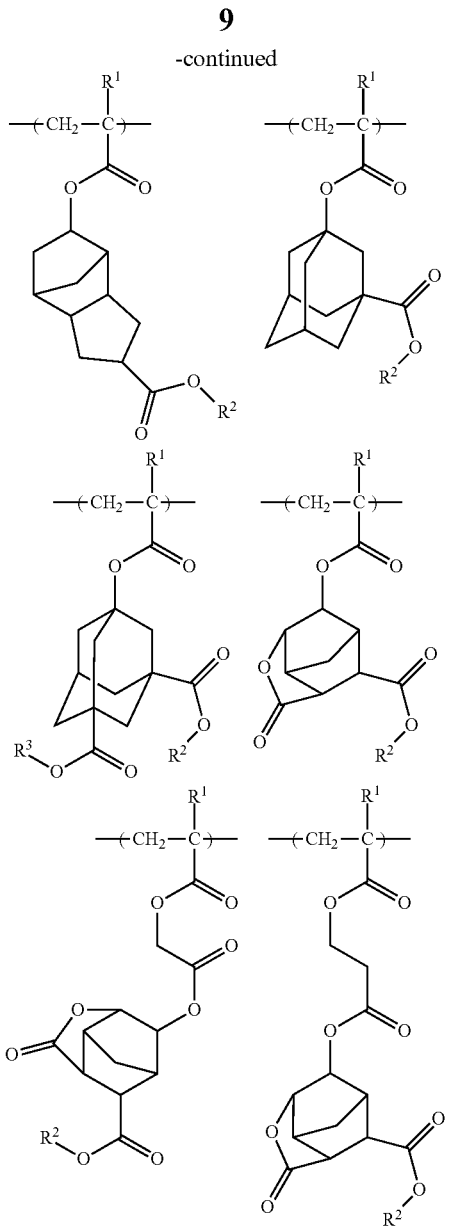

Herein R¹, R² and R³ are as defined above.

The acid labile group represented by R² and R³ is not particularly limited as long as it is decomposed under the action of an acid to regenerate a carboxyl group. Suitable acid labile groups include alkoxymethyl groups of the general formula (L1) and tertiary alkyl groups of the general formulae (L2) to (L8), but are not limited thereto.

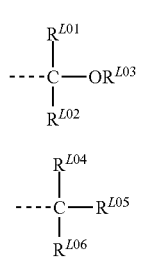

-continued

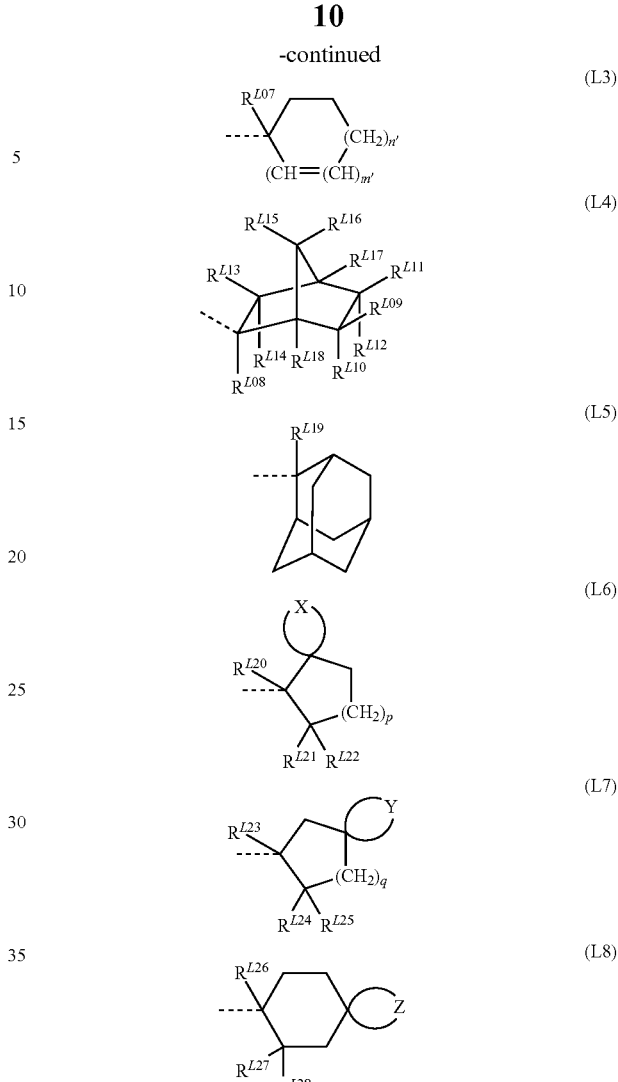

Herein and throughout the specification, the broken line denotes a valence bond.

In formula (L1), $R^{L01}$ and $R^{L02}$ each are hydrogen or a straight, branched or cyclic alkyl group of 1 to 18 carbon atoms, preferably 1 to 10 carbon atoms, examples of which include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of these groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$. Exemplary substituted alkyl groups are illustrated below.

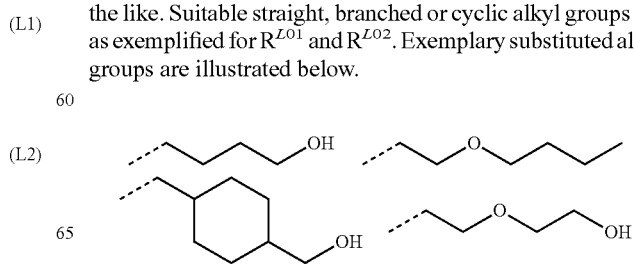

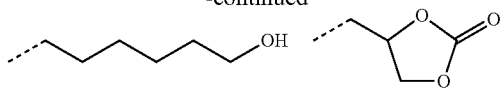

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$, and $R^{L03}$ represents a straight or branched alkylene group of 1 to 18 carbon atoms, preferably 1 to 10 carbon atoms when they form a ring.

In formula (L2), $R^{L04}$, $R^{L05}$, and $R^{L06}$ are each independently a straight, branched or cyclic $C_1$-$C_{15}$ alkyl group. Suitable alkyl groups include methyl, ethyl, propyl, isopropyl, n-butyl, sec-butyl, tert-butyl, cyclopentyl, cyclohexyl, 2-ethylhexyl, n-octyl, 1-adamantyl, and 2-adamantyl.

In formula (L3), $R^{L07}$ is an optionally substituted, straight, branched or cyclic $C_1$-$C_{10}$ alkyl group or optionally substituted $C_6$-$C_{20}$ aryl group. Examples of the optionally substituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl; and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups or in which one or more methylene moiety is replaced by an oxygen or sulfur atom. Exemplary optionally substituted aryl groups are phenyl, methylphenyl, naphthyl, anthryl, phenanthryl, and pyrenyl. In formula (L3), m' is 0 or 1, n' is 0, 1, 2 or 3, and 2m'+n' is equal to 2 or 3.

In formula (L4), $R^{L08}$ is an optionally substituted, straight, branched or cyclic $C_1$-$C_{10}$ alkyl group or optionally substituted $C_6$-$C_{20}$ aryl group. Examples are as exemplified for $R^{L07}$. $R^{L09}$ to $R^{L18}$ each independently denote hydrogen or a monovalent $C_1$-$C_{15}$ hydrocarbon group. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups. Alternatively, a pair of $R^{L09}$ and $R^{L10}$, $R^{L09}$ and $R^{L11}$, $R^{L09}$ and $R^{L12}$, $R^{L10}$ and $R^{L12}$, $R^{L11}$ and $R^{L12}$, $R^{L13}$ and $R^{L14}$, or $R^{L15}$ and $R^{L16}$ may bond together to form a ring. Each of $R^{L09}$ to $R^{L18}$ represents a divalent $C_1$-$C_{15}$ hydrocarbon group when they form a ring, examples of which are those exemplified above for the monovalent hydrocarbon groups, with one hydrogen atom being eliminated. Also a pair of $R^{L09}$ and $R^{L11}$, $R^{L11}$ and $R^{L17}$, or $R^{L15}$ and $R^{L17}$ which are attached to vicinal carbon atoms may bond together directly to form a double bond.

In formula (L5), $R^{L19}$ is an optionally substituted, straight, branched or cyclic $C_1$-$C_{10}$ alkyl group or optionally substituted $C_6$-$C_{20}$ aryl group. Examples are as exemplified for $R^{L07}$.

In formula (L6), $R^{L20}$ is an optionally substituted, straight, branched or cyclic $C_1$-$C_{10}$ alkyl group or optionally substituted $C_6$-$C_{20}$ aryl group. Examples are as exemplified for $R^{L07}$. X is a divalent group that forms an optionally substituted cyclopentane, cyclohexane or norbornane ring with the carbon atom to which it is attached. $R^{L21}$ and $R^{L22}$ are each independently hydrogen or a straight, branched or cyclic, monovalent hydrocarbon group of 1 to 10 carbon atoms. $R^{L21}$ and $R^{L22}$ may bond together to form a ring with the carbon atom to which they are attached, and in this case, $R^{L21}$ and $R^{L22}$ taken together represent a divalent group that forms an optionally substituted cyclopentane or cyclohexane ring. The subscript p is 1 or 2.

In formula (L7), $R^{L23}$ is an optionally substituted, straight, branched or cyclic $C_1$-$C_{10}$ alkyl group or optionally substituted $C_6$-$C_{20}$ aryl group. Examples are as exemplified for $R^{L07}$. Y is a divalent group that forms an optionally substituted cyclopentane, cyclohexane or norbornane ring with the carbon atom to which it is attached. $R^{L24}$ and $R^{L25}$ are each independently hydrogen or a straight, branched or cyclic, monovalent hydrocarbon group of 1 to 10 carbon atoms. $R^{L24}$ and $R^{L25}$ may bond together to form a ring with the carbon atom to which they are attached, and in this case, $R^{L24}$ and $R^{L25}$ taken together represent a divalent group that forms an optionally substituted cyclopentane or cyclohexane ring. The subscript q is 1 or 2.

In formula (L8), $R^{L26}$ is an optionally substituted, straight, branched or cyclic $C_1$-$C_{10}$ alkyl group or optionally substituted $C_6$-$C_{20}$ aryl group. Examples are as exemplified for $R^{L07}$. Z is a divalent group that forms an optionally substituted cyclopentane, cyclohexane or norbornane ring with the carbon atom to which it is attached. $R^{L27}$ and $R^{L28}$ are each independently hydrogen or a straight, branched or cyclic, monovalent hydrocarbon group of 1 to 10 carbon atoms. $R^{L27}$ and $R^{L28}$ may bond together to form a ring with the carbon atom to which they are attached, and in this case, $R^{L27}$ and $R^{L28}$ taken together represent a divalent group that forms an optionally substituted cyclopentane or cyclohexane ring.

Of the acid labile groups of formula (L1), suitable straight or branched groups are exemplified below.

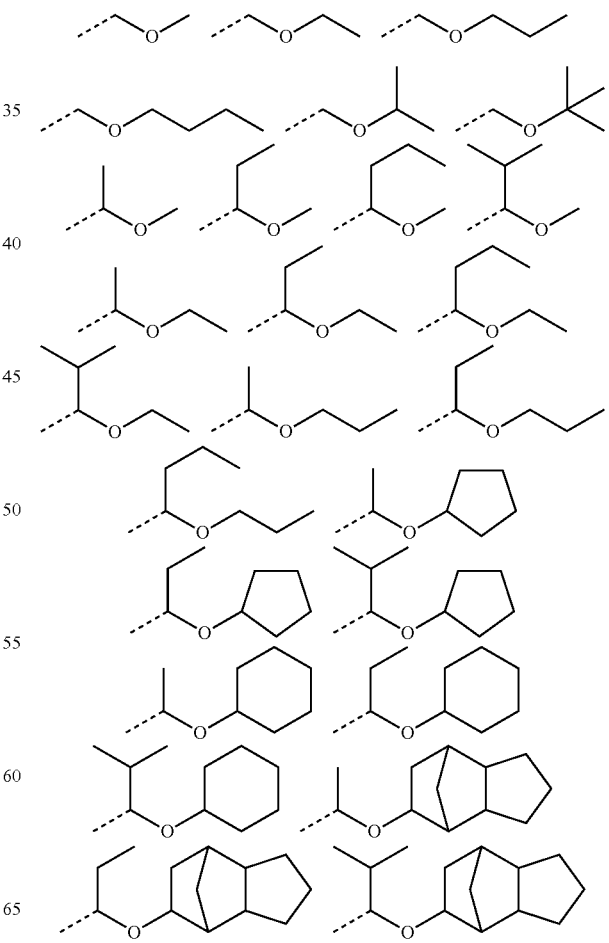

-continued

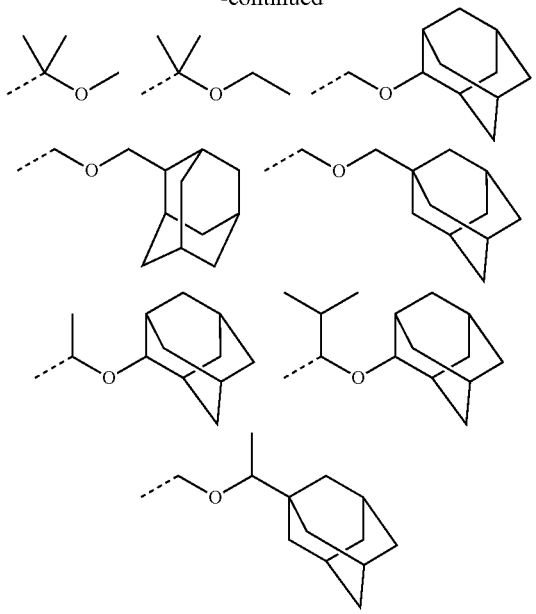

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile group of formula (L2) include tert-butyl, tert-amyl, and the groups shown below.

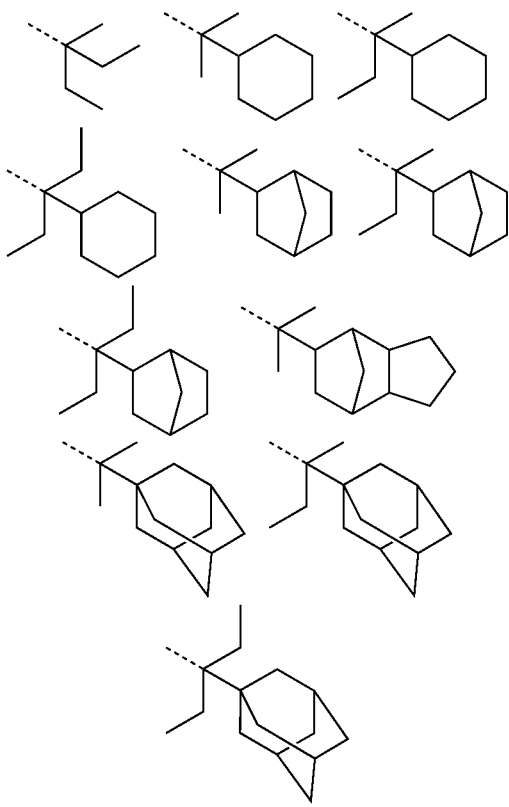

Examples of the acid labile group of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are more preferred.

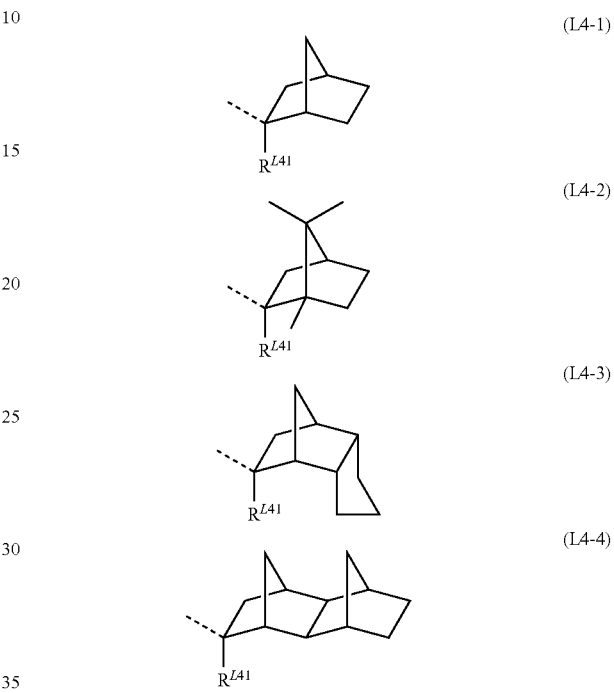

In formulae (L4-1) to (L4-4), the broken line denotes a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

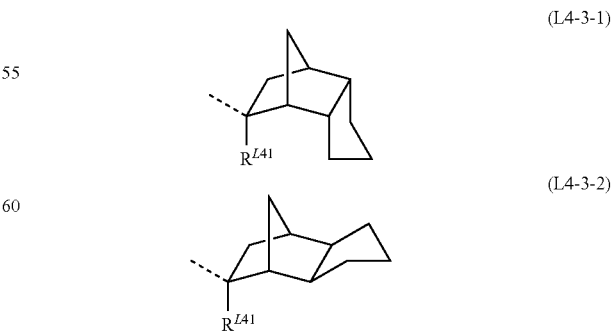

Herein $R^{L41}$ is as defined above.

Similarly, the general formula (L4-4) represents one or a mixture of two or more selected from groups having the following general formulas (L4-4-1) to (L4-4-4).

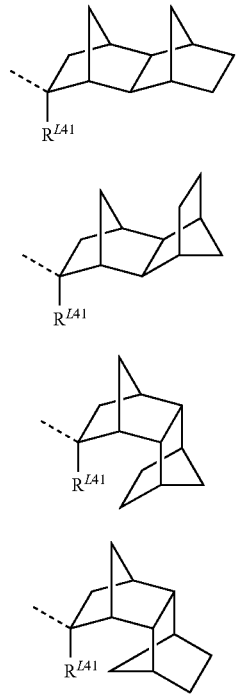

(L4-4-1)

(L4-4-2)

(L4-4-3)

(L4-4-4)

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid-catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

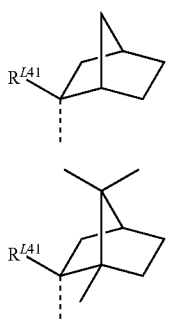

(L4-1-endo)

(L4-2-endo)

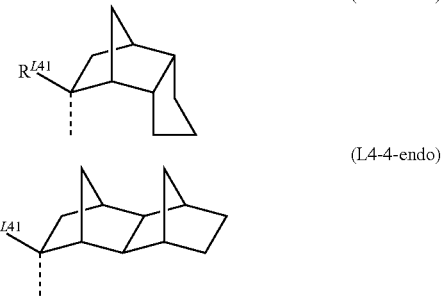

(L4-3-endo)

(L4-4-endo)

Herein $R^{L41}$ is as defined above.

Illustrative examples of the acid labile group of formula (L4) are given below, but not limited thereto.

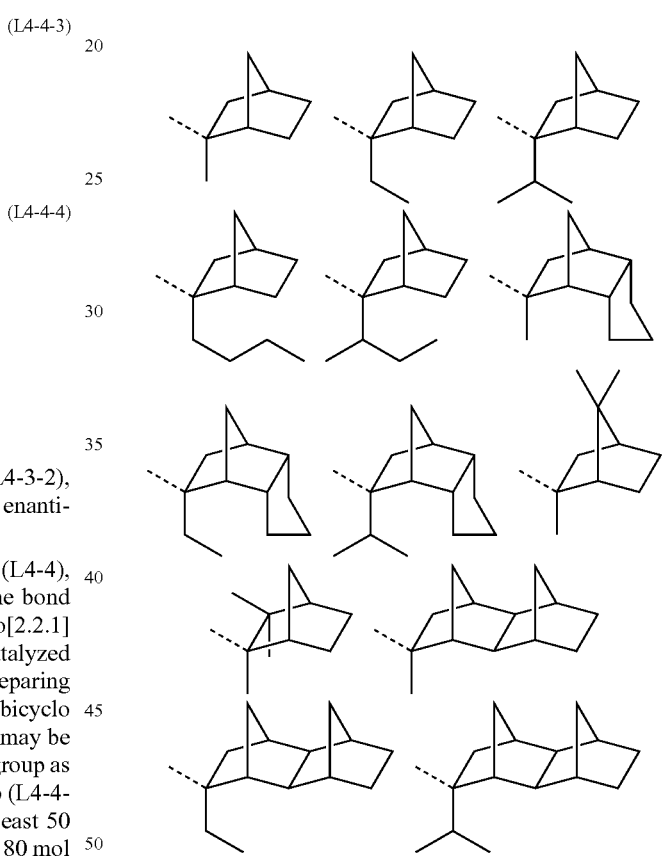

Examples of the acid labile group of formula (L5) are shown below.

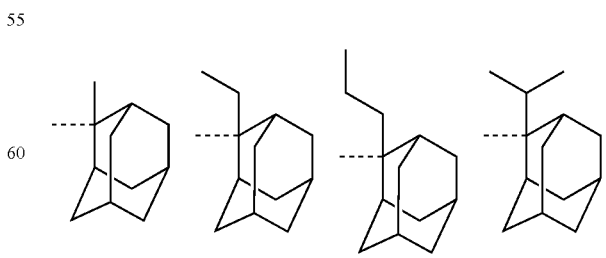

Examples of the acid labile group of formula (L6) are shown below.

Examples of the acid labile group of formula (L7) are shown below.
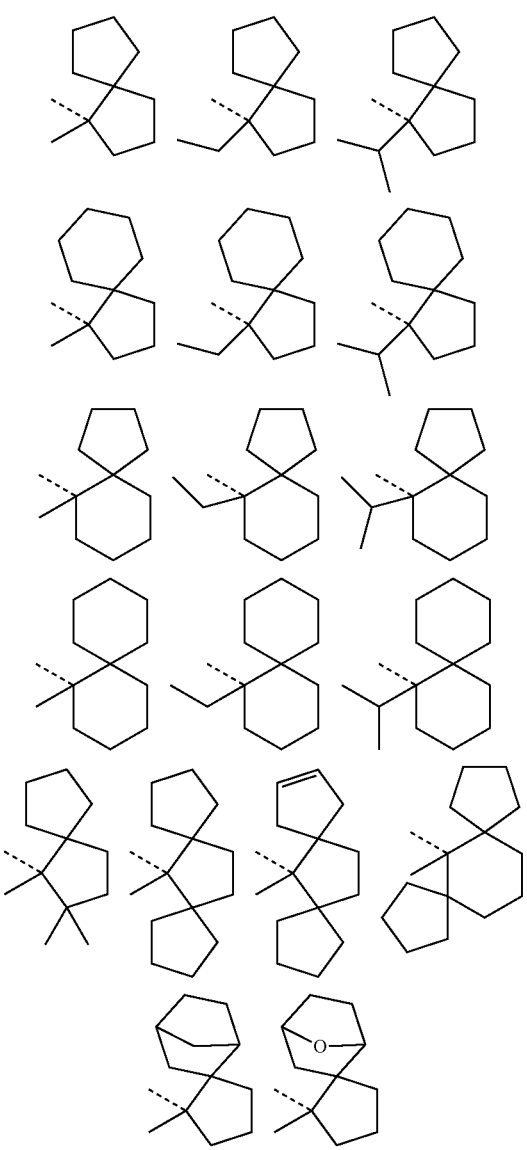
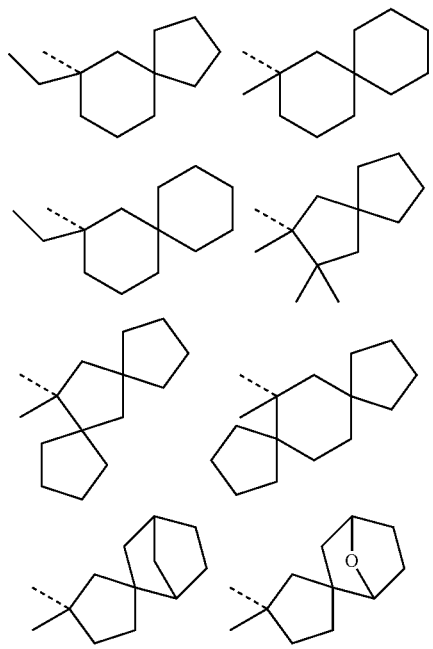
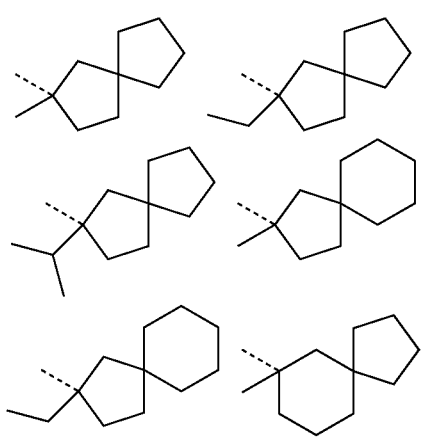
Examples of the acid labile group of formula (L8) are shown below.
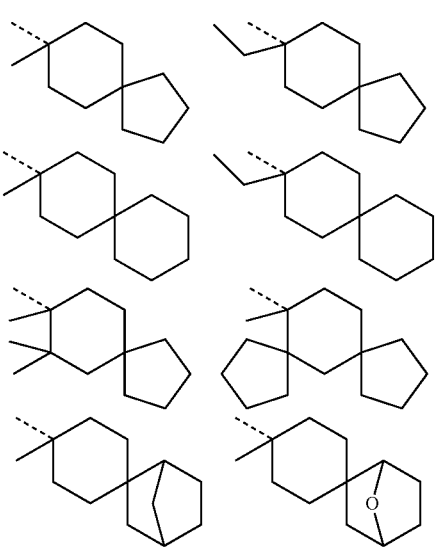
In a preferred embodiment, either one or both of acid labile groups $R^2$ and $R^3$ in formula (1) have the general formula (2):
(2)
wherein the broken line denotes a valence bond, $R^4$ is a straight, branched or cyclic $C_1$-$C_6$ alkyl group, and n is 0 or 1.

Illustrative, non-limiting examples of the acid labile group having formula (2) are given below.

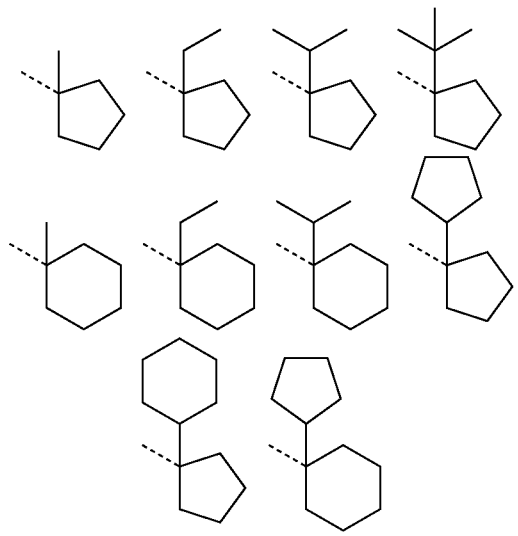

In addition to the recurring units (a1) having a carboxyl group protected with an acid labile group, the polymer (A) comprises recurring units (a2) having at least one structure selected from among amino group, amide bond, carbamate bond, and nitrogen-containing heterocycle.

These nitrogen-containing units display a quencher function of capturing an acid generated by a PAG to inhibit acid diffusion. The binding of the quencher in the base polymer inhibits not only acid diffusion, but also quencher diffusion, and prevents degradation of a latent image contrast. Since the quencher bound in the base polymer does not volatilize from the resist film subsurface layer, it prevents surface insolubilization during negative development.

Preferably the recurring units (a2) have the structure of the general formula (3) or (4).

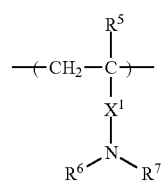

(3)

Herein $R^5$ is hydrogen or methyl. $X^1$ is a single bond or a divalent, straight, branched or cyclic $C_1$-$C_{15}$ hydrocarbon group which may contain an oxygen atom. $R^6$ and $R^7$ are each independently hydrogen or a monovalent, straight, branched or cyclic $C_1$-$C_{15}$ hydrocarbon group which may contain a heteroatom and in which one or more hydrogen atoms may be substituted by fluorine atoms, or $R^6$ and $R^7$ may bond together to form a ring with the nitrogen atom to which they are attached, or either one or both of $R^6$ and $R^7$ may bond with $X^1$ to form a ring with the nitrogen atom to which they are attached.

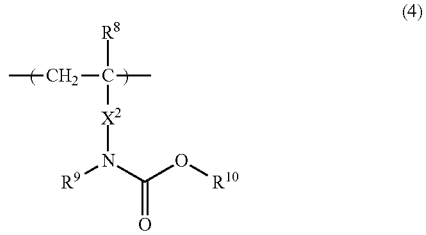

(4)

Herein $R^8$ is hydrogen or methyl. $X^2$ is a single bond or a divalent, straight, branched or cyclic $C_1$-$C_{15}$ hydrocarbon group which may contain an oxygen atom. $R^9$ is hydrogen or a monovalent, straight, branched or cyclic $C_1$-$C_{15}$ hydrocarbon group which may contain a heteroatom and in which one or more hydrogen atoms may be substituted by fluorine atoms, or $R^9$ may bond with $X^2$ to form a ring with the nitrogen atom to which they are attached, and $R^{10}$ is a monovalent $C_3$-$C_{15}$ hydrocarbon group which may contain a heteroatom.

Illustrative examples of the structure having formula (3) are given below, but not limited thereto.

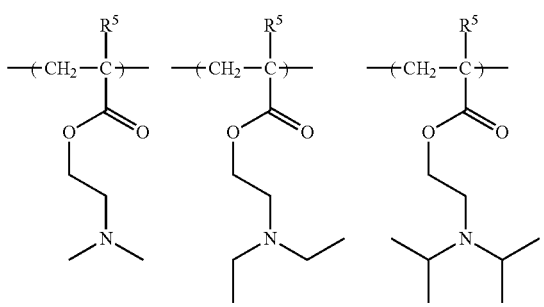

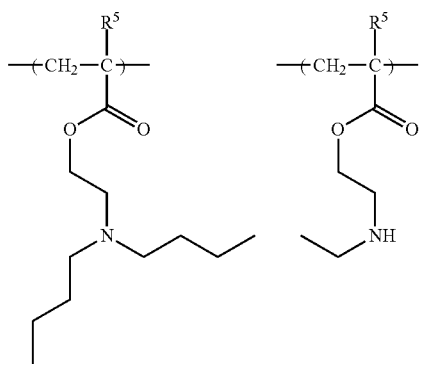

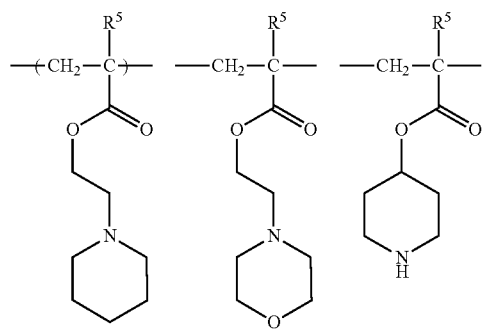

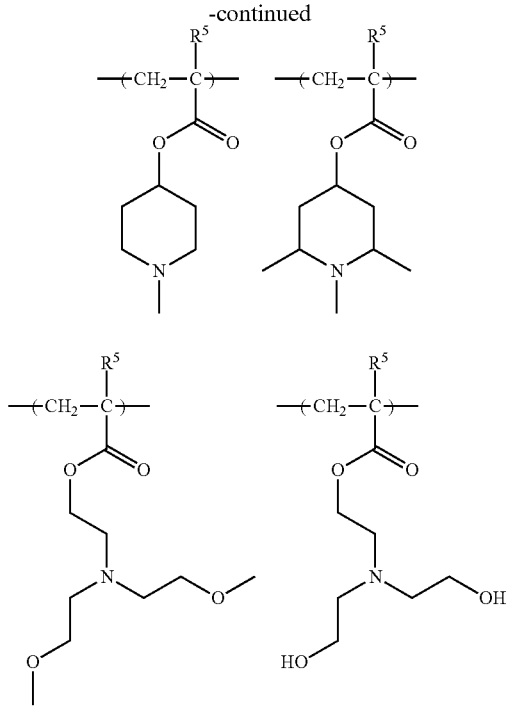
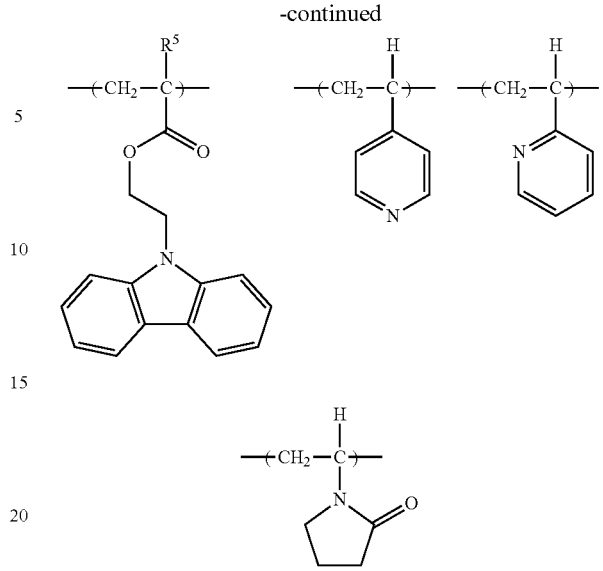
Herein $R^5$ is as defined above.
Illustrative examples of the structure having formula (4) are given below, but not limited thereto.
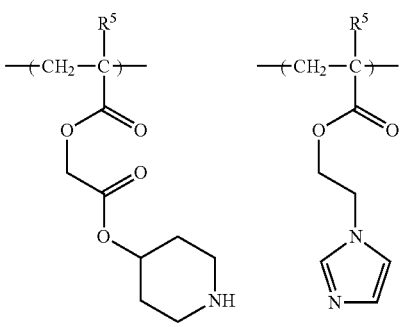
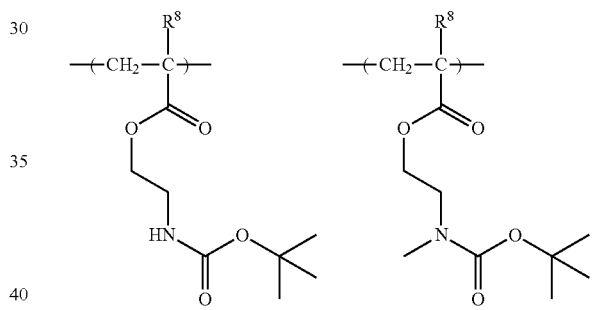
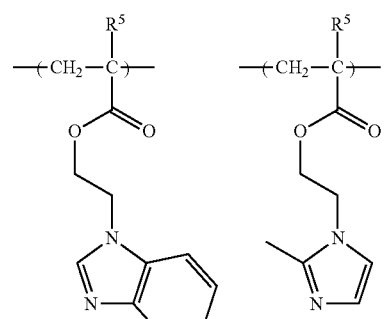
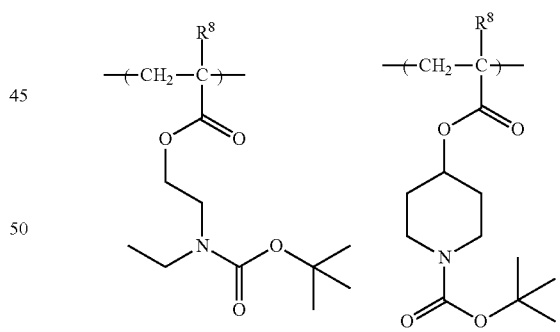
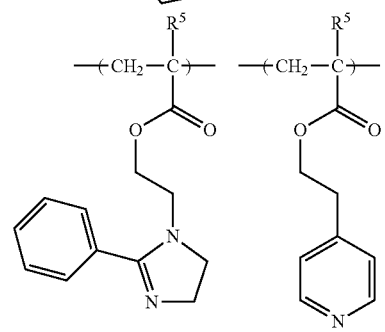
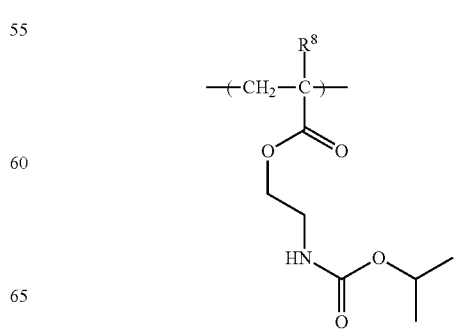

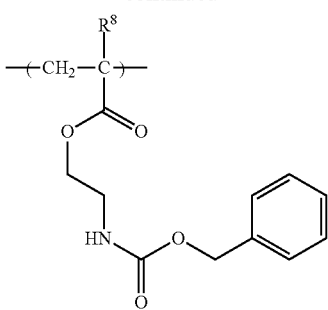

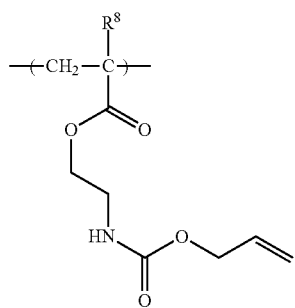

Herein R⁸ is as defined above.

The polymer (A) may further comprise recurring units having a polar functional group selected from among hydroxyl, carboxyl, cyano, carbonyl, ether, ester, carbonic acid ester, and sulfonic acid ester, as an adhesive group.

Examples of recurring units containing carboxyl include, but are not limited to, the above-illustrated examples of the units having formula (1), with the proviso that the carboxyl group is not protected with the acid labile group.

Examples of recurring units containing hydroxyl and recurring units containing carboxyl include the following structures, but are not limited thereto.

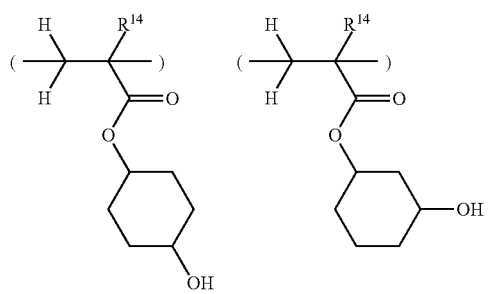

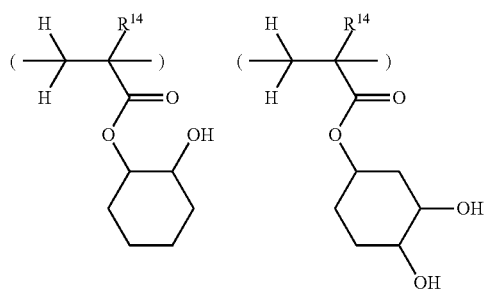

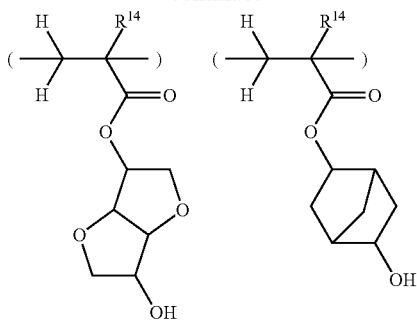

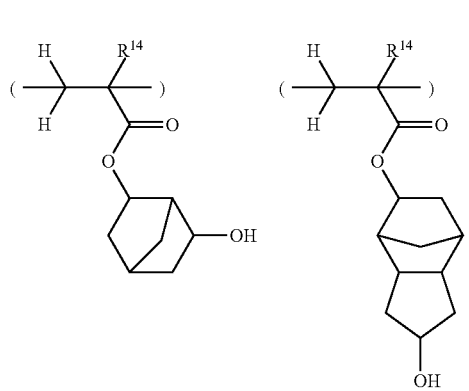

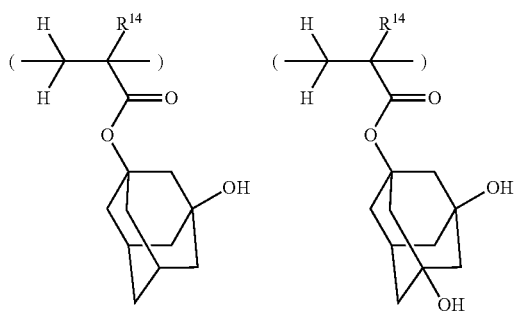

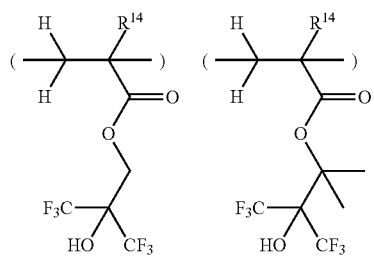

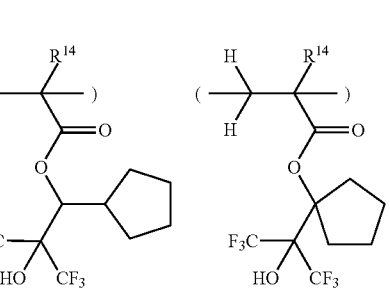

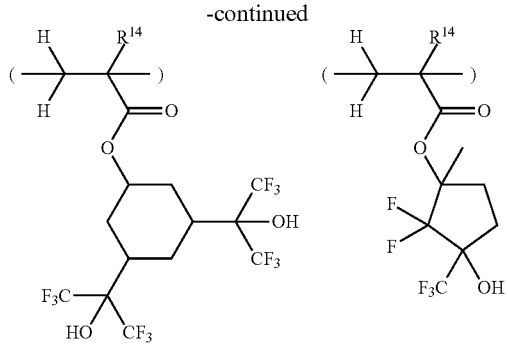
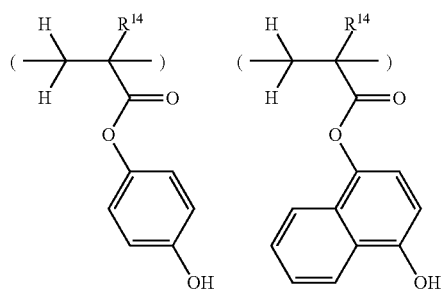
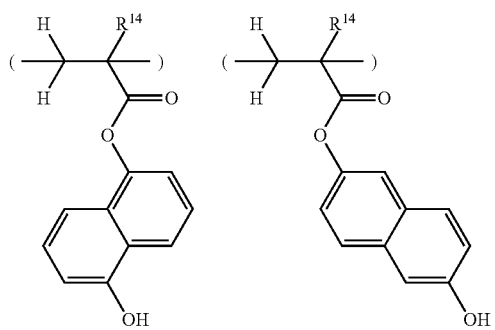
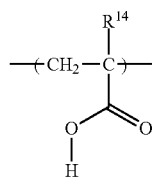
Herein R[14] is hydrogen, methyl or trifluoromethyl.
Examples of recurring units containing a polar functional group such as cyano, carbonyl, ether, ester, carbonic acid ester, or sulfonic acid ester include the following structures, but are not limited thereto.
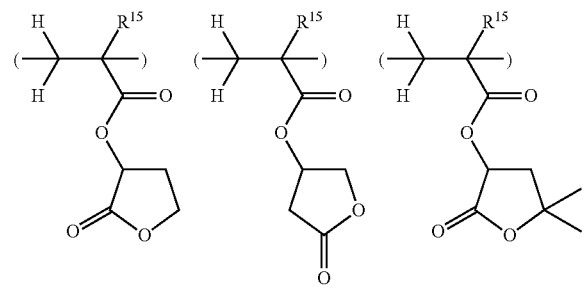
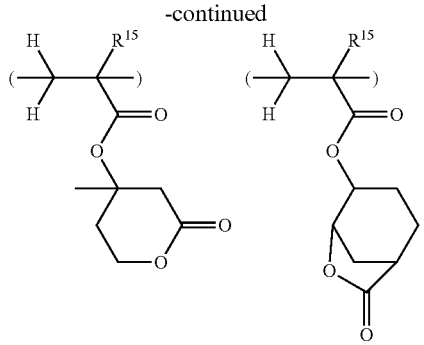
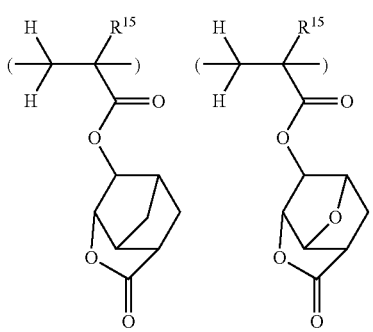
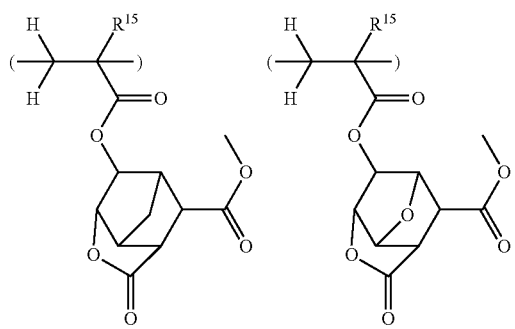
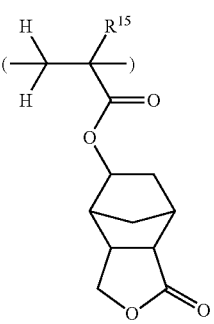
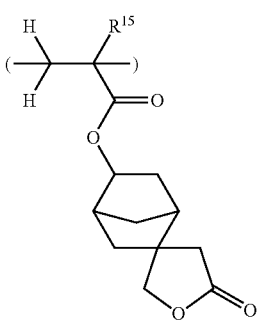
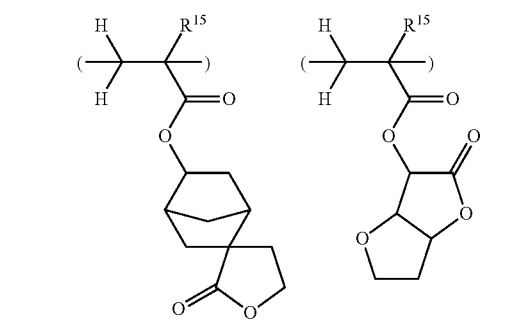

-continued
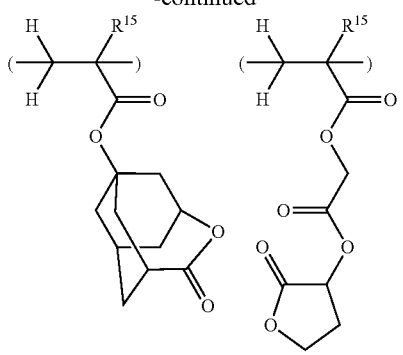
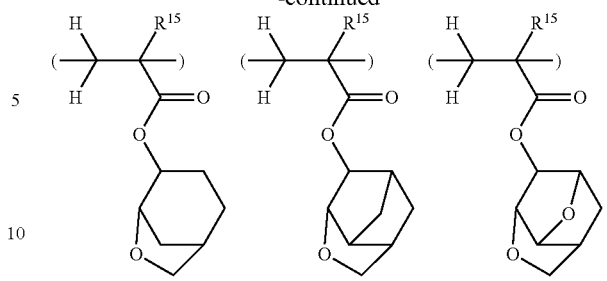
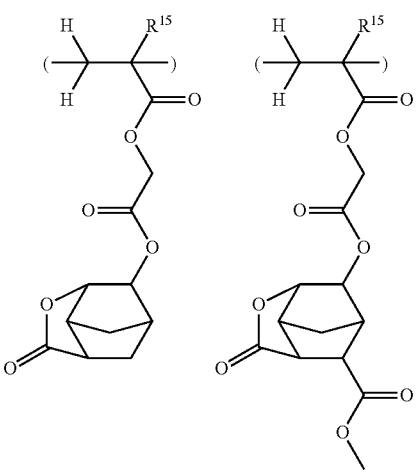
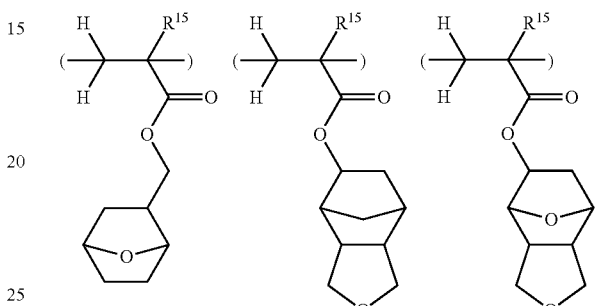
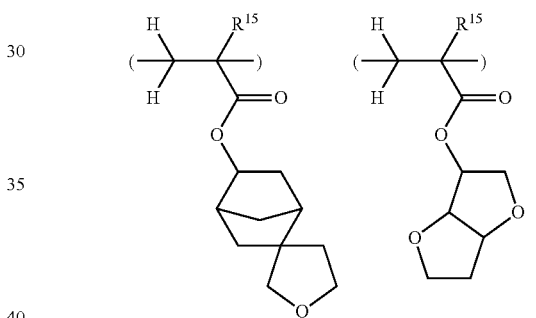
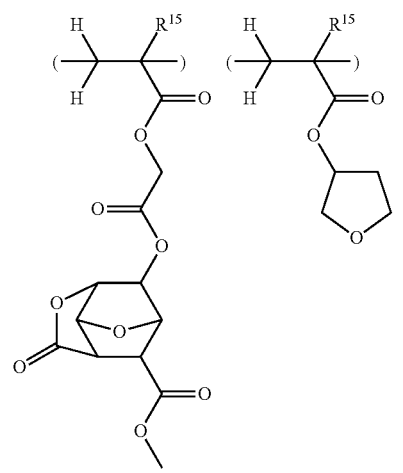
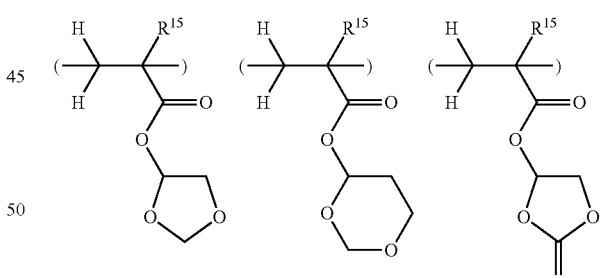
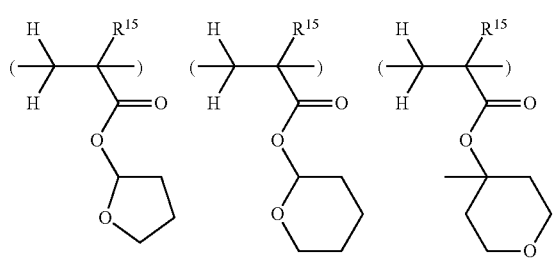
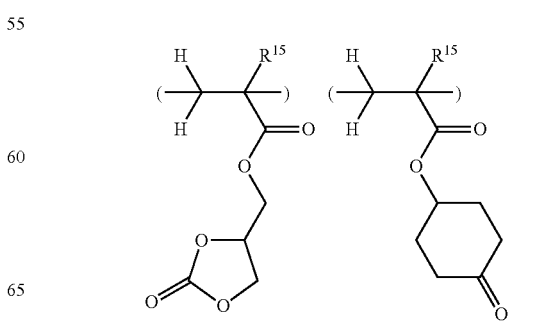

-continued

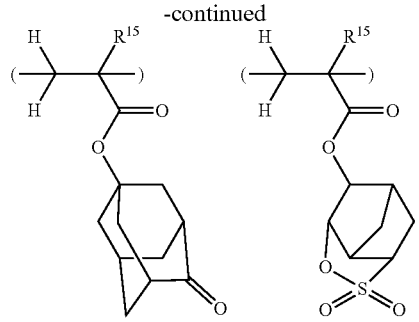

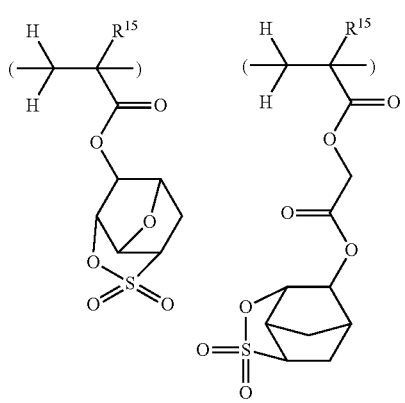

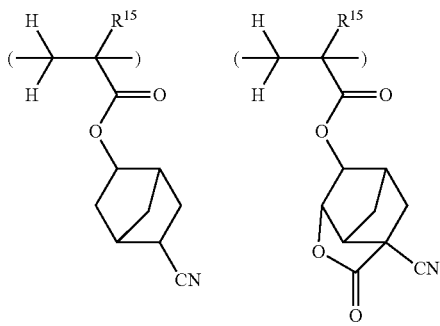

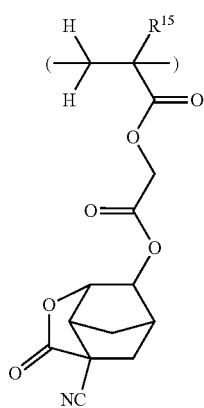

Herein $R^{15}$ is hydrogen, methyl or trifluoromethyl.

The polymer (A) may have further copolymerized therein a sulfonium salt of the structure having the general formula (p1), (p2) or (p3).

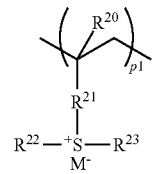

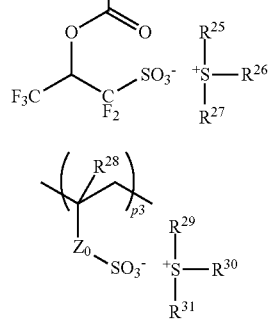

Herein $R^{20}$, $R^{24}$ and $R^{28}$ each are hydrogen or methyl. $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene group or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—$R^{32}$—, or —C(=O)—$Z_1$—$R^{32}$— wherein $Z_1$ is oxygen or NH, and $R^{32}$ is a straight, branched or cyclic $C_1$-$C_6$ alkylene group, alkenylene group or phenylene group, which may contain a carbonyl, ester, ether or hydroxyl radical. M⁻ is a non-nucleophilic counter ion.

Reference is made to the molar fraction of the respective recurring units of which polymer (A) is composed. Provided that a1 is a total amount of recurring units (a1) having a carboxyl group protected with an acid labile group, a2 is a total amount of recurring units (a2) having at least one structure selected from among amino group, amide bond, carbamate bond, and nitrogen-containing heterocycle, a3 is a total amount of recurring units having a polar functional group such as hydroxyl, carboxyl, cyano, carbonyl, ether, ester, carbonic acid ester or sulfonic acid ester, and p is a total amount of sulfonium salt units having the structure of formula (p1), (p2) or (p3), the molar fraction preferably falls in the range: $0.1 \leq a1 \leq 0.995$, $0.005 \leq a2 \leq 0.2$, $0 \leq a3 \leq 0.8$, and $0 \leq p \leq 0.2$. More preferably, the molar fraction falls in the range: $0.2 \leq a1 \leq 0.7$, $0.01 \leq a2 \leq 0.1$, $0.2 \leq a3 \leq 0.7$, and $0 \leq p \leq 0.1$. It is noted that $a1+a2+a3+p=1$.

The polymer (A) should preferably have a weight average molecular weight (Mw) in the range of 3,000 to 100,000, and more preferably 5,000 to 50,000. Although the molecular weight distribution or dispersity (Mw/Mn) of the polymer is not particularly limited, a narrow dispersity in the range of 1.0 to 3.0 is preferred. Such a narrow dispersity advantageously leads to inhibited acid diffusion and improved resolution. It is noted that Mw and Mn are measured by GPC versus polystyrene standards using tetrahydrofuran solvent.

The resist composition used herein further comprises (B) a photoacid generator, i.e., PAG and (C) an organic solvent.

The PAG is preferably used in an amount of 0.5 to 30 parts, more preferably 1 to 20 parts by weight per 100 parts by weight of the base resin. The PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Examples of the PAG used herein are described in JP-A 2008-111103, paragraphs [0123] to [0138] (U.S. Pat. No. 7,537,880).

The organic solvent is preferably used in an amount of 100 to 10,000 parts, more preferably 300 to 8,000 parts by weight per 100 parts by weight of the base resin. Examples of the organic solvent used herein are described in JP-A 2008-111103, paragraph [0144] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and other alcohols such as diethylene glycol, propylene glycol, glycerol, 1,4-butane diol, and 1,3-butane diol, and mixtures thereof.

While the resist composition used herein essentially comprises the above-mentioned polymer (A), PAG (B) and organic solvent (C), it may optionally further comprise any one or more of quencher, surfactant, dissolution regulator, acetylene alcohol, and other components.

The quencher is a component having a function of trapping and deactivating the acid generated by the acid generator. As is known in the art, the quencher is effective, when added in an appropriate amount, for adjusting sensitivity, improving dissolution contrast, and improving resolution by restraining acid diffusion into the unexposed region. While the recurring units (a2) in polymer (A) can function as a quencher, addition of a separate quencher is sometimes effective for controlling resist sensitivity and regulating pattern profile.

Typical quenchers are basic compounds. Exemplary basic compounds include primary, secondary and tertiary amine compounds, specifically amine compounds having a hydroxyl, ether, ester, lactone, cyano or sulfonic acid ester group, as described in JP-A 2008-111103, paragraphs [0148] to [0163], and nitrogen-containing organic compounds having a carbamate group, as described in JP 3790649. When added, an amount of the basic compound used is preferably 0.01 to 10 parts, more preferably 0.1 to 5 parts by weight per 100 parts by weight of the base resin.

An onium salt compound having an anion combined with weak acid as conjugate acid may be used as the quencher. The quenching mechanism is based on the phenomenon that a strong acid generated by the acid generator is converted into an onium salt through salt exchange reaction. With an weak acid resulting from salt exchange, deprotection reaction of the acid labile group in the base resin does not take place, and so the weak acid onium salt compound in this system functions as a quencher. Onium salt quenchers include onium salts such as sulfonium salts, iodonium salts and ammonium salts of sulfonic acids which are not fluorinated at α-position as described in US 2008153030 (JP-A 2008-158339), and similar onium salts of carboxylic acid. These onium salts can function as the quencher when they are combined with acid generators capable of generating an α-position fluorinated sulfonic acid, imide acid or methide acid. When onium salt quenchers are photo-decomposable like sulfonium salts and iodonium salts, their quench capability is reduced in a high light intensity portion, whereby dissolution contrast is improved. When a negative pattern is formed by organic solvent development, the pattern is thus improved in rectangularity. When added, an amount of the onium salt compound used is preferably 0.05 to 20 parts, more preferably 0.2 to 10 parts by weight per 100 parts by weight of the base resin.

The quenchers including the nitrogen-containing organic compounds and onium salt compounds mentioned above may be used alone or in admixture of two or more.

Suitable surfactants are described in JP-A 2008-111103, paragraph [0166]. Suitable dissolution regulators are described in JP-A 2008-122932, paragraphs [0155] to [0178]. Suitable acetylene alcohols are described in JP-A 2008-122932, paragraphs [0179] to [0182]. When added, the surfactant may be used in any desired amount as long as the objects of the invention are not impaired.

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as developer. The water repellency improver of specific structure with a 1,1,1,3,3,3-hexafluoro-2-propanol residue is readily soluble in organic solvents as well as in alkaline aqueous solution. A polymer having an amino group or amine salt copolymerized as recurring units may serve as the water repellency improver and is effective for preventing evaporation of acid during PEB and avoiding any hole pattern opening failure after development. When added, an appropriate amount of the water repellency improver is 0.1 to 20 parts, preferably 0.5 to 10 parts by weight per 100 parts by weight of the base resin.

Process

As alluded previously, the pattern forming process of the invention comprises the steps of coating the resist composition defined above onto a substrate, prebaking the resist composition to form a resist film, exposing a selected region of the resist film to high-energy radiation, baking (PEB), and developing the exposed resist film in an organic solvent-based developer to selectively dissolve the unexposed region of resist film, thereby forming a negative tone pattern.

Now referring to the drawings, the pattern forming process of the invention is illustrated in FIG. 1. First, the resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is prebaked (or post-applied bake (PAB)), preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Figure 1B:
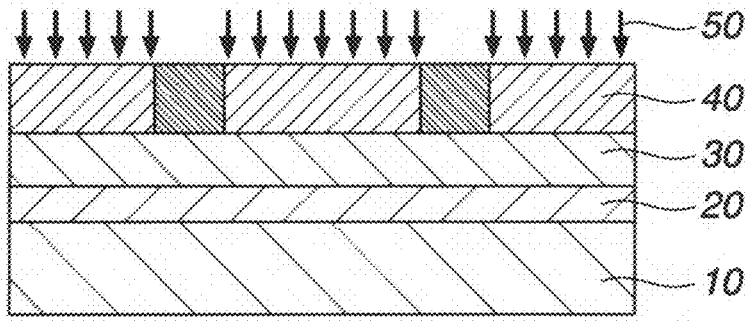
FIG. 1B shows the resist film being exposed.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm wavelength. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after PAB for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent-based developer, the polymer comprising recurring units derived from a monomer having a 1,1,1,3,3,3-hexafluoro-2-propanol residue dissolves in the aforementioned organic solvent-based developers. In particular, protective film-forming materials having 1,1,1,3,3,3-hexafluoro-2-propanol residues as described in JP-A 2007-025634 and 2008-003569 readily dissolve in the organic solvent-based developer.

In the protective film-forming composition, an amine compound or amine salt may be added, or a polymer comprising recurring units containing an amino group or amine salt copolymerized therein may be used as the base resin. This component is effective for controlling diffusion of the acid generated in the exposed region of the resist film to the unexposed region for thereby preventing any hole opening failure. A useful protective film-forming composition having an amine compound added thereto is described in JP-A 2008-003569. A useful protective film-forming composition containing a polymer having an amino group or amine salt copolymerized therein is described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the resist film, deionized water rinsing (or post-soaking) may be carried out for extracting the acid generator and other components from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound or amine salt added thereto is more effective for preventing acid evaporation.

The protective film is preferably formed from a composition comprising a polymer bearing a 1,1,1,3,3,3-hexafluoro-2-propanol residue and an amino group or amine salt-containing compound, or a composition comprising a polymer comprising recurring units having a 1,1,1,3,3,3-hexafluoro-2-propanol residue and recurring units having an amino group or amine salt copolymerized, the composition further comprising an alcohol solvent of at least 4 carbon atoms, an ether solvent of 8 to 12 carbon atoms, or a mixture thereof.

Suitable alcohols of 4 or more carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether.

Exposure is preferably performed in an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Figure 1C:
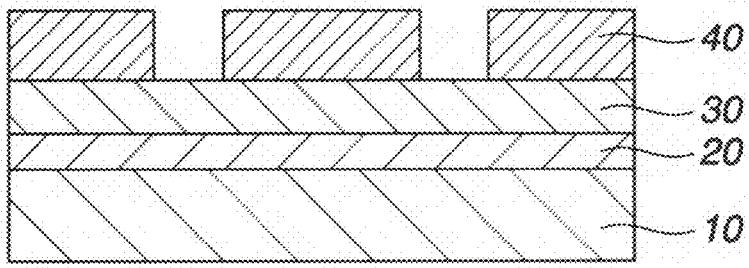
FIG. 1C shows the resist film being developed in an organic solvent.

Thereafter the exposed resist film is developed in an organic solvent-based developer for 0.1 to 3 minutes, preferably 0.5 to 2 minutes by any conventional techniques such as dip, puddle and spray techniques. In this way, the unexposed region of resist film is dissolved away, leaving a negative resist pattern 40 on the substrate 10 as shown in FIG. 1C.

The organic solvent used as the developer is preferably selected from among ketones such as 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, and 4'-methylacetophenone; and esters such as propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

These organic solvents may be used alone or in admixture of two or more. The total amount of these organic solvents used is at least 60% by weight, preferably 80 to 100% by weight of the developer. When the total amount of these organic solvents is less than 100% by weight of the developer, there may be contained another organic solvent. Examples of the other organic solvent include alkanes such as octane, decane and dodecane, and alcohols such as isopropyl alcohol, 1-butyl alcohol, 1-pentanol, 1-hexanol, and 4-methyl-2-pentanol. The developer may also contain a surfactant, examples of which are the same as those of the surfactant to be added to the resist composition.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. These solvents may be used alone or in admixture. Besides the foregoing solvents, aromatic solvents may be used, for example, toluene, xylene, ethylbenzene, isopropylbenzene, tert-butylbenzene and mesitylene.

In forming a trench pattern, negative tone development is often successful in forming an optical image with a higher contrast than positive tone development. As used herein, the term "trench pattern" refers to a line-and-space pattern in which the spaces are narrower than the lines, that is, the space size is smaller than the line width. The pattern in which spaces are separated indefinitely apart, that is, the line width is indefinitely extended is referred to as "isolated trench pattern." As the trench (or space) width becomes finer, the negative tone development adapted to form trenches by reversal of a line pattern image on a mask becomes more advantageous to insure a resolution.

The method of forming a hole pattern by negative tone development is typically classified in terms of mask design into the following three methods:

(i) performing exposure through a mask having a dotted light-shielding pattern so that a pattern of holes may be formed at the dots after negative tone development,
(ii) performing exposure through a mask having a lattice-like light-shielding pattern so that a pattern of holes may be formed at the intersections of gratings after negative tone development, and
(iii) performing two exposures using a mask having a lined light-shielding pattern, changing the direction of lines during second exposure from the direction of lines during first exposure so that the lines of the second exposure may intersect with the lines of the first exposure, whereby a pattern of holes is formed at the intersections of lines after negative tone development.

Figure 7:
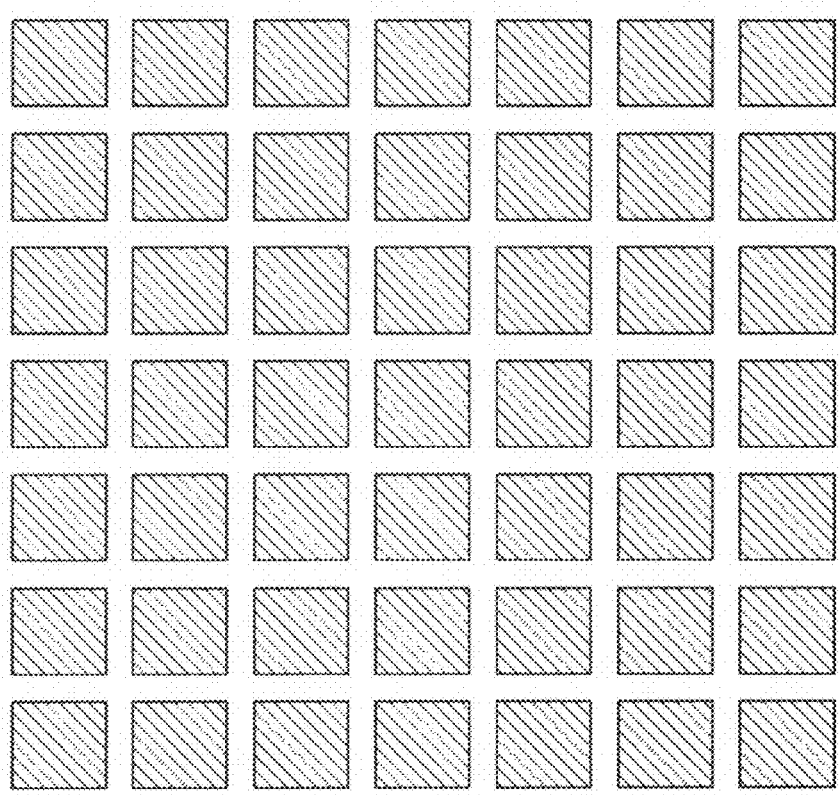
FIG. 7 illustrates a mask bearing a dot pattern of square dots.
Figure 17:
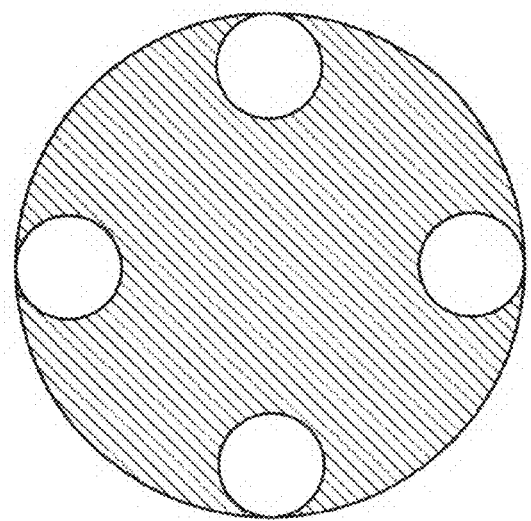
FIG. 17 illustrates an aperture configuration in an exposure tool of cross-pole illumination for enhancing the contrast of both X and Y-direction lines.

Method (i) uses a mask having a dotted light-shielding pattern as shown in FIG. 7. Although the illumination for exposure used in this method is not particularly limited, a cross-pole illumination or quadra-pole illumination with the aperture configuration shown in FIG. 17 is preferred for the purpose of reducing the pitch. The contrast may be improved by combining the cross-pole illumination with X-Y polarized illumination or azimuthally polarized illumination of circular polarization.

Figure 5:
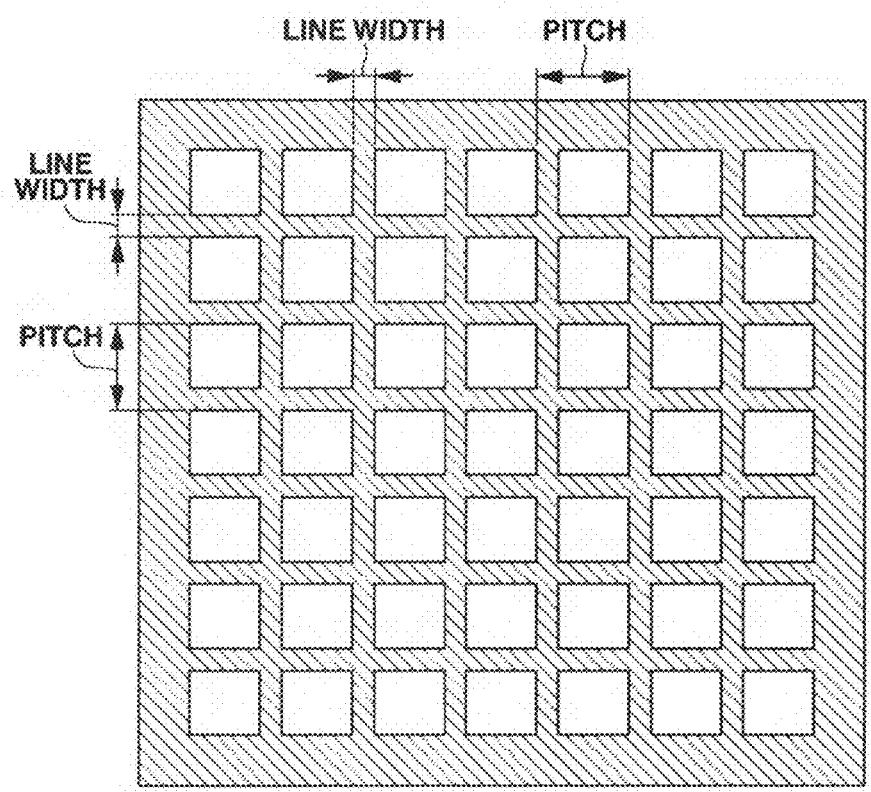
FIG. 5 illustrates a mask bearing a lattice-like pattern.

Method (ii) uses a mask having a lattice-like light-shielding pattern as shown in FIG. 5. Like Method (i), a combination of cross-pole illumination with polarized illumination is preferred for the purpose of improving resolution even at a narrow pitch.

Figure 6:
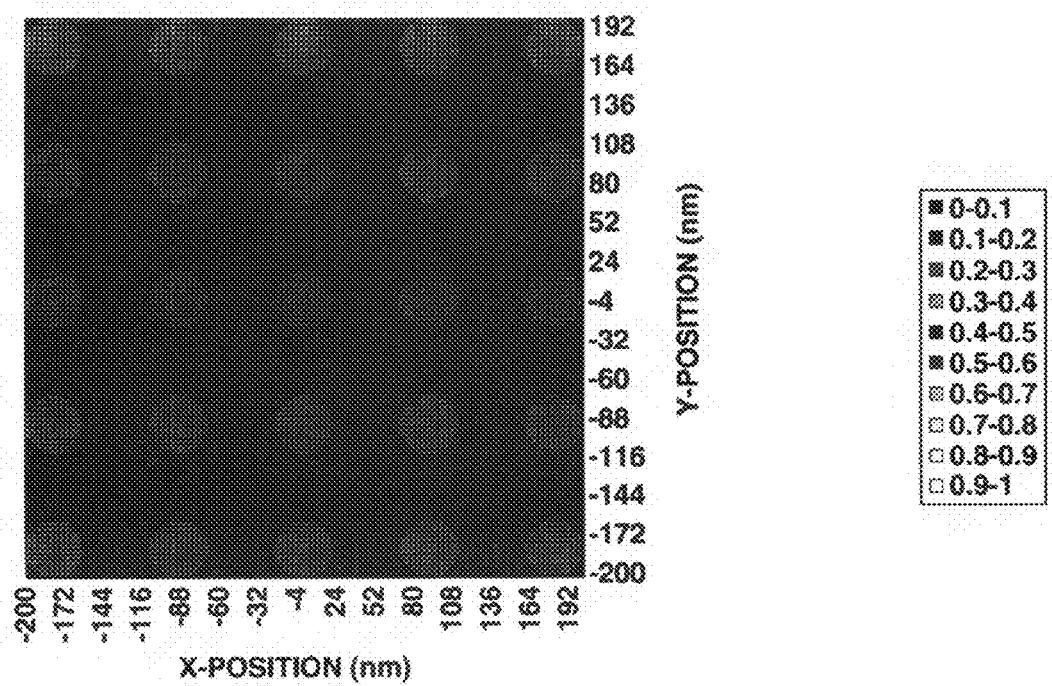
FIG. 6 is an optical image of a lattice-like pattern having a pitch of 90 nm and a width of 30 nm printed under conditions: NA 1.3 lens, cross-pole illumination, 6% halftone phase shift mask, and azimuthally polarized illumination.
Figure 8:
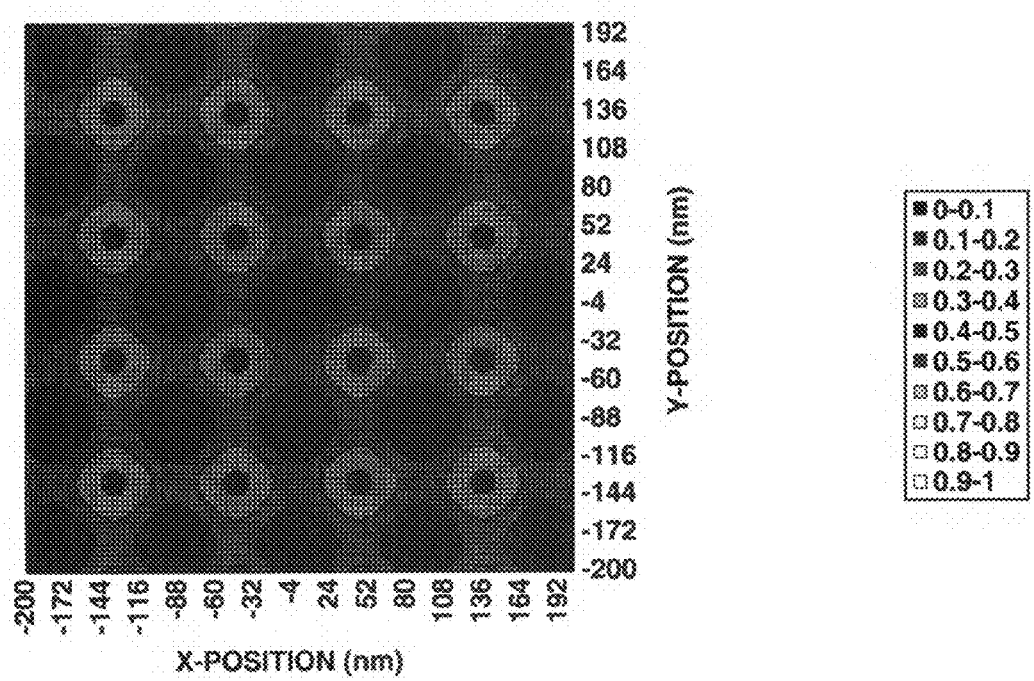
FIG. 8 is an optical image of a square dot pattern having a pitch of 90 nm and a side width of 60 nm printed under conditions: NA 1.3 lens, cross-pole illumination, 6% halftone phase shift mask, and azimuthally polarized illumination, showing its contrast.

On use of a mask bearing a dot pattern of square dots having a pitch of 90 nm and a side width of 60 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. On use of a mask bearing a lattice-like line pattern having a pitch of 90 nm and a width of 30 nm as shown in FIG. 5, under conditions: NA 1.3 lens, cross-pole illumination, 6% halftone phase shift mask, and azimuthally polarized illumination, an optical image is obtained as shown in FIG. 6. As compared with the use of the dot pattern, the use of the lattice-like pattern has the advantage of enhanced optical contrast despite the drawback of reduced resist sensitivity due to reduced light intensity.

In Method (ii), the procedure of using a half-tone phase shift mask having a transmittance of 3 to 15% and converting the intersections of lattice-like shifter gratings into a pattern of holes after development is preferred because the optical contrast is improved.

Figure 15:
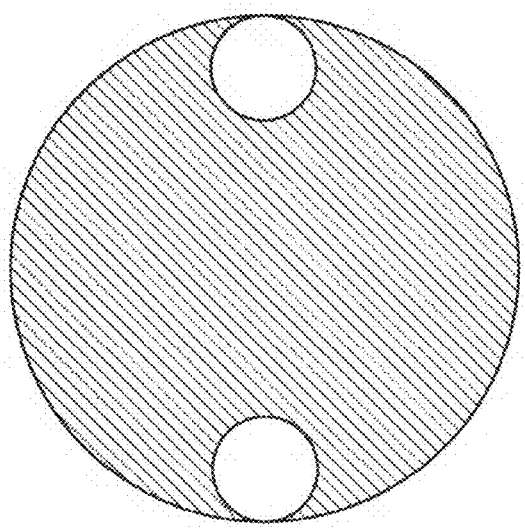
FIG. 15 illustrates an aperture configuration in an exposure tool of dipole illumination for enhancing the contrast of X-direction lines.
Figure 16:
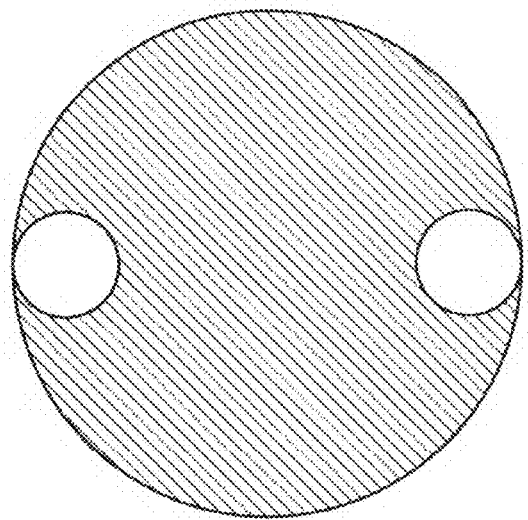
FIG. 16 illustrates an aperture configuration in an exposure tool of dipole illumination for enhancing the contrast of Y-direction lines.

Method (iii) can achieve a further higher contrast than Methods (i) and (ii) by using dipole illumination with aperture configurations as shown in FIGS. 15 and 16, performing exposure to X and Y-direction line patterns in two separate steps, and overlaying the resulting optical images. The contrast may be enhanced by combining dipole illumination with s-polarized illumination.

Figure 2:
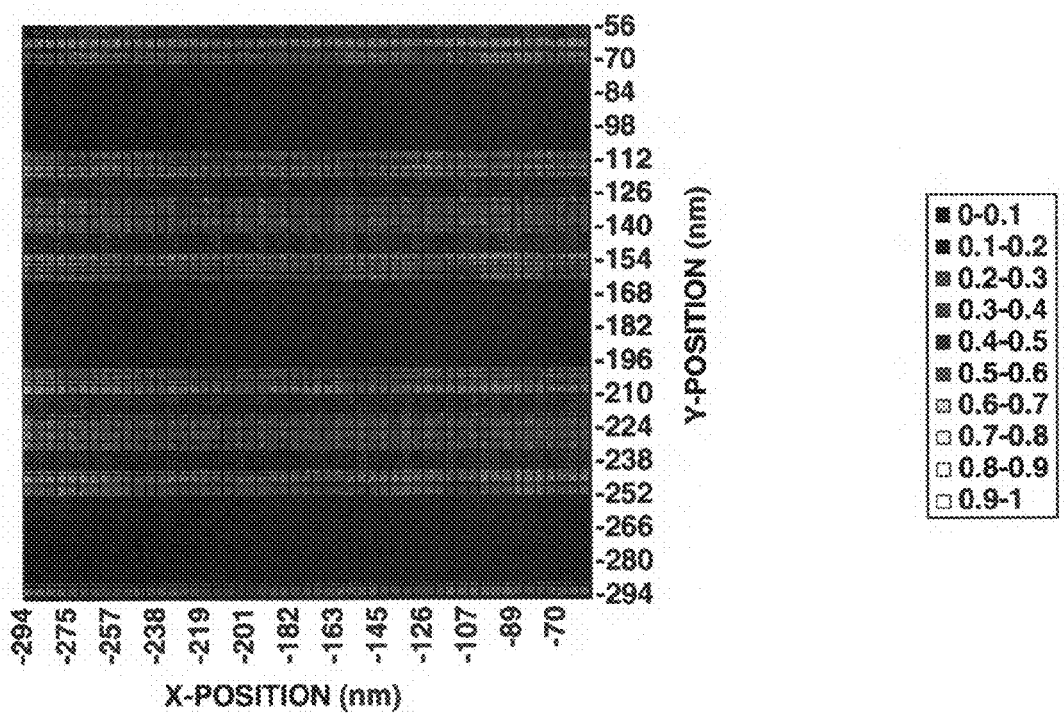
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.
Figure 3:
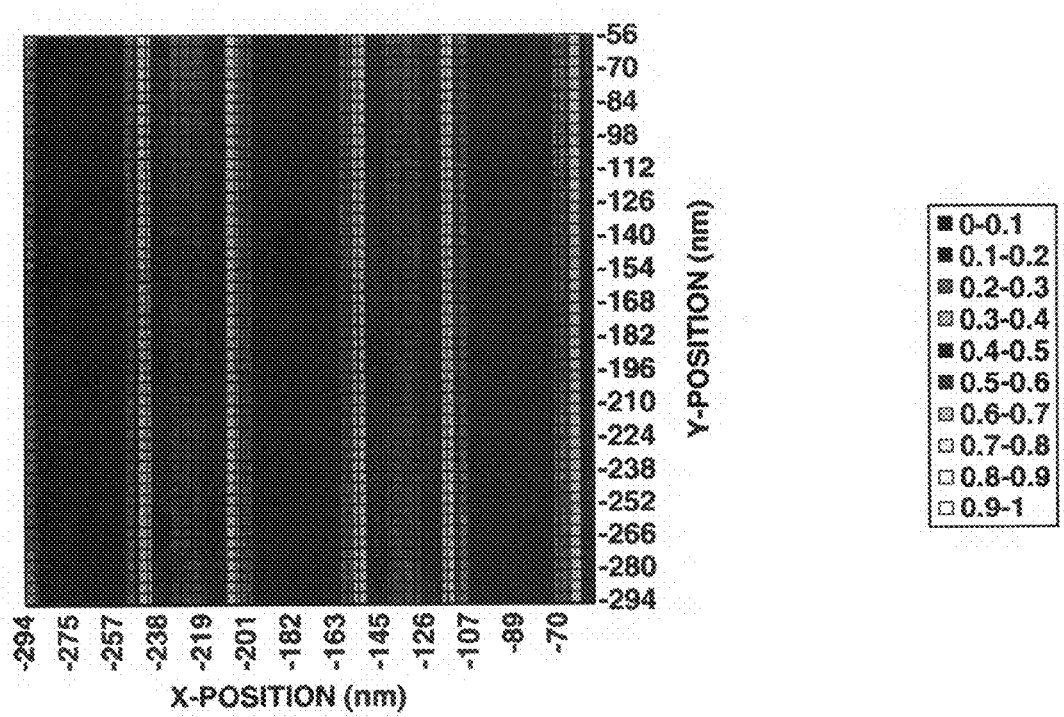
FIG. 3 is an optical image of Y-direction lines like FIG. 2.
Figure 4:
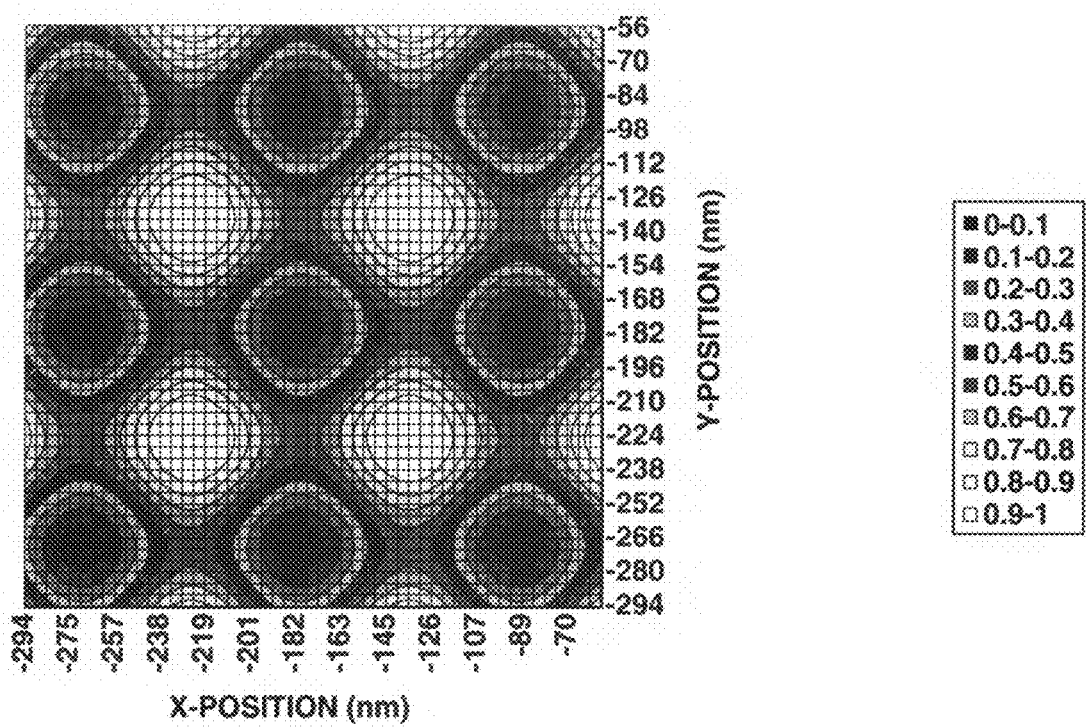
FIG. 4 shows a contrast image obtained by overlaying the optical image of X-direction lines in FIG. 2 with the optical image of Y-direction lines in FIG. 3.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization. FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area. FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Since Method (iii) involving double exposures provides a high optical contrast despite a reduced throughput as compared with Methods (i) and (ii) involving a single exposure, Method (iii) can form a fine pattern with uniformity of size and is advantageous for pitch narrowing. The angle between the first and second lines is preferably right, but may deviate from 90°, and the size and/or pitch may be the same or different between the first lines and the second lines. If a single mask bearing first lines in one area and second lines in another area is used, it is possible to carry out first and second exposures continuously. Two consecutive exposures using a single mask with the X and Y-direction contrasts emphasized can be carried out on the currently commercially available scanner.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a resist composition, specifically dissolution contrast and acid diffusion, the proximity bias of a mask varies with the type of resist composition. For a particular type of resist composition, a mask having a different proximity bias must be used. This adds to the burden of mask manufacturing.

Then the pack and unpack (PAU) method is proposed in Proc. SPIE Vol. 5753, p171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

To form a random pitch hole pattern by positive/negative reversal, a mask is used in which a lattice-like light-shielding pattern is arrayed over the entire surface and the width of gratings is thickened only where holes are to be formed.

Figure 9:
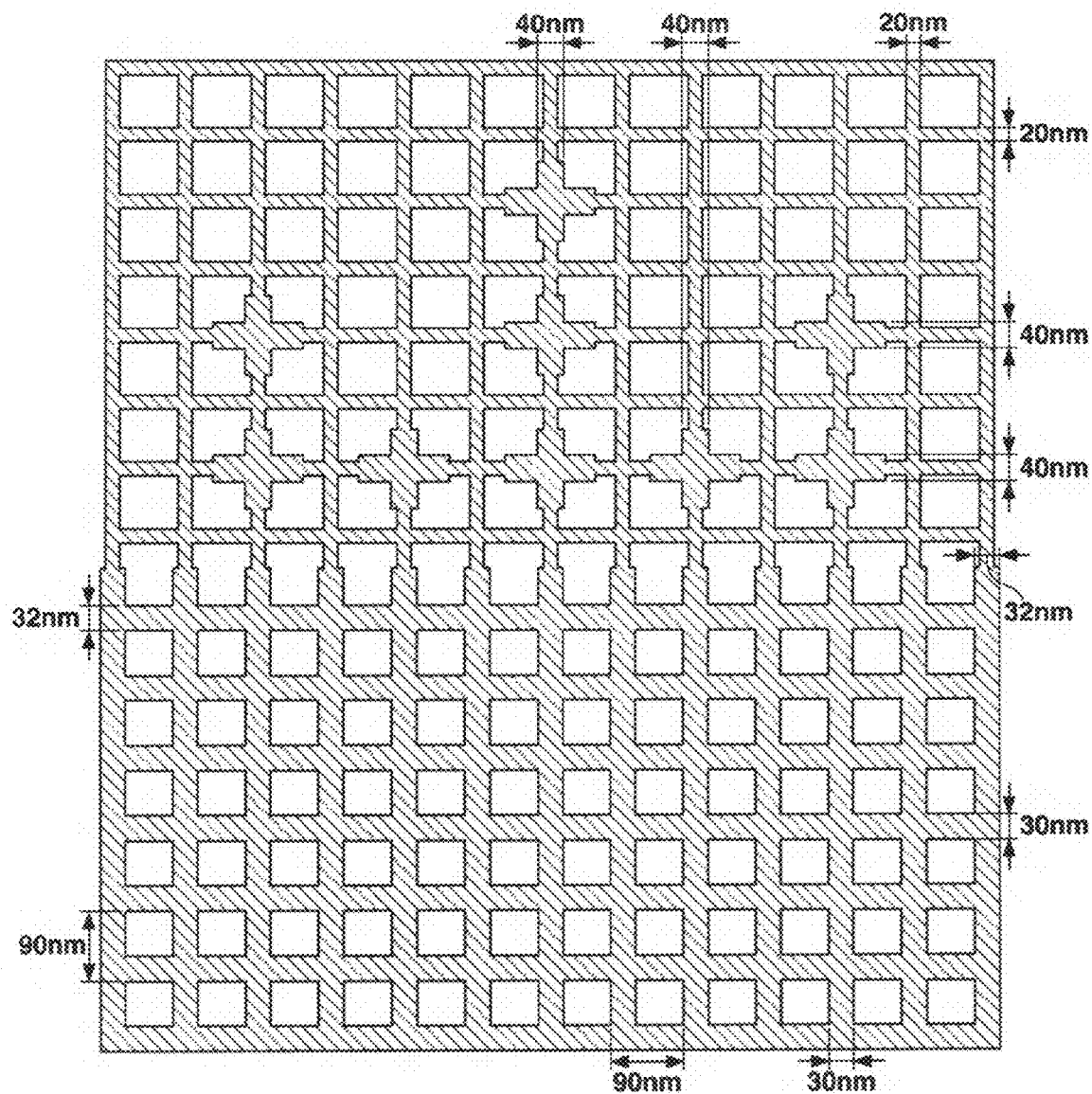
FIG. 9 illustrates a mask bearing a lattice-like pattern having a pitch of 90 nm and a line width of 20 nm on which thick crisscross or intersecting line segments are disposed where dots are to be formed.
Figure 11:
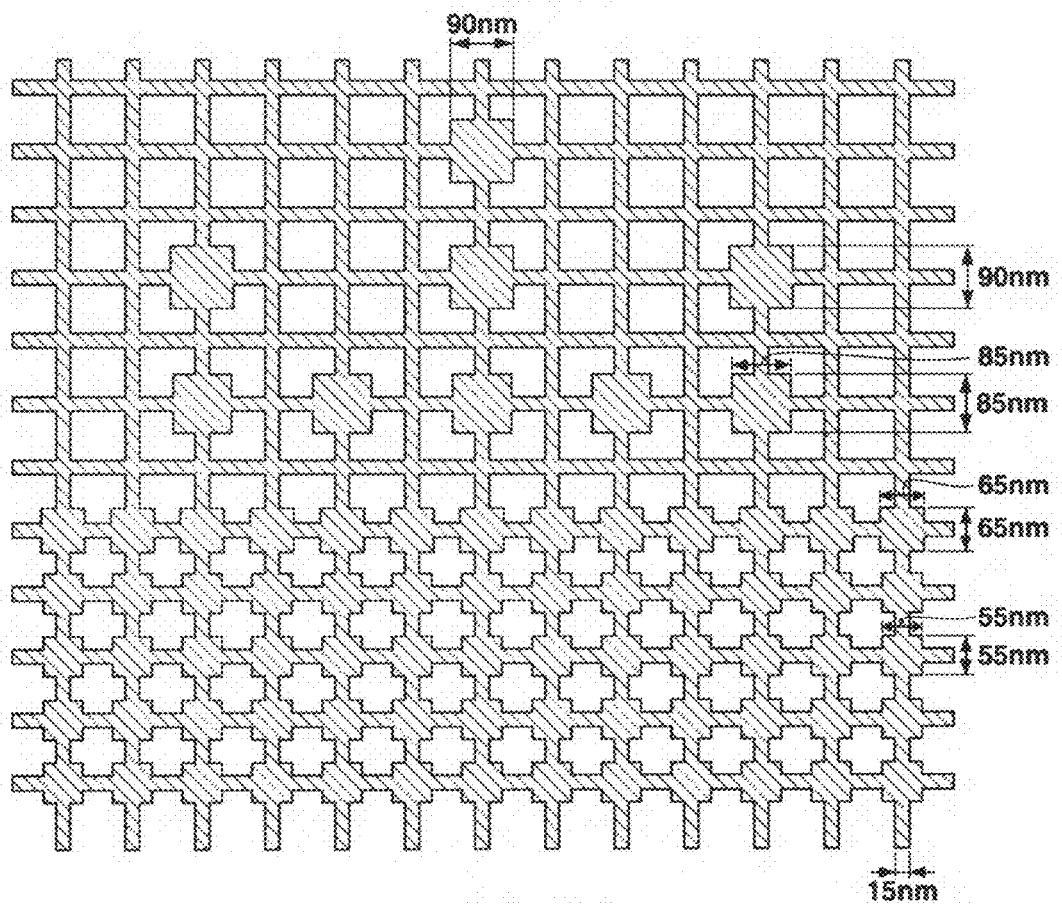
FIG. 11 illustrates a mask bearing a lattice-like pattern having a pitch of 90 nm and a line width of 15 nm on which thick dots are disposed where dots are to be formed.

In Method (ii), a pattern of holes at random pitches can be formed by using a phase shift mask including a lattice-like first shifter having a line width equal to or less than a half pitch and a second shifter arrayed on the first shifter and consisting of lines whose on-wafer size is 2 to 30 nm thicker than the line width of the first shifter as shown in FIG. 9, whereby a pattern of holes is formed only where the thick shifter is arrayed. Alternatively, a pattern of holes at random pitches can be formed by using a phase shift mask including a lattice-like first shifter having a line width equal to or less than a half pitch and a second shifter arrayed on the first shifter and consisting of dots whose on-wafer size is 2 to 100 nm thicker than the line width of the first shifter as shown in FIG. 11, whereby a pattern of holes is formed only where the thick shifter is arrayed.

As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern.

Figure 10:
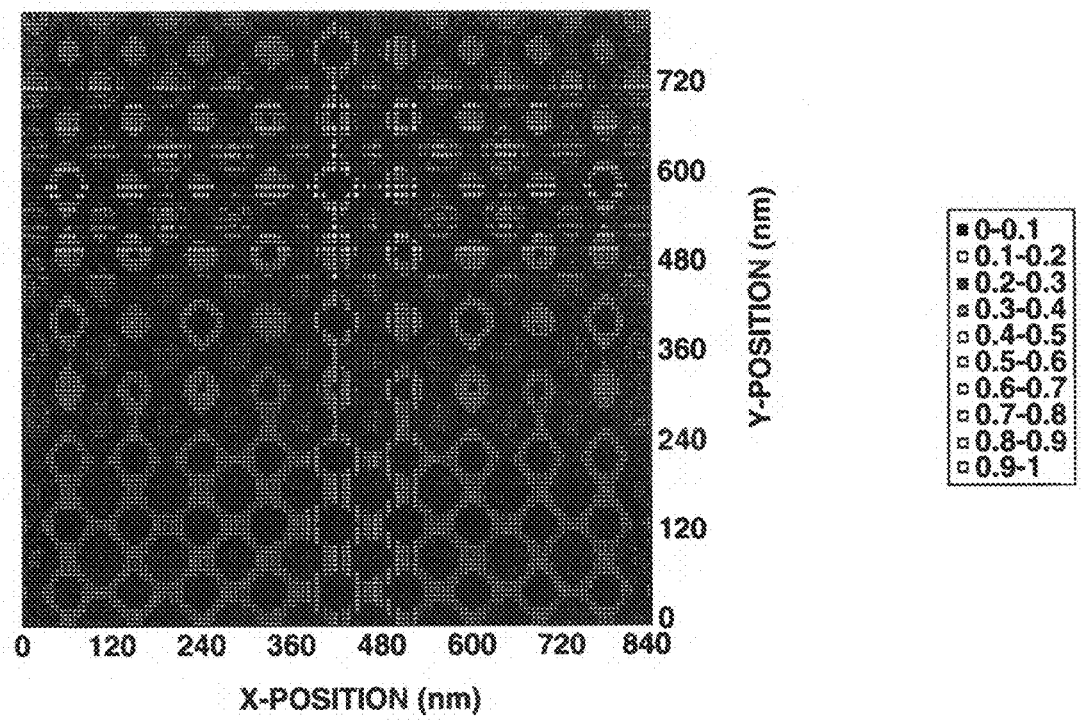
FIG. 10 is an optical image resulting from the mask of FIG. 9, printed under conditions: NA 1.3 lens, cross-pole illumination, 6% halftone phase shift mask, and azimuthally polarized illumination, showing its contrast.

FIG. 10 shows an optical image from the mask of FIG. 9, indicating the contrast thereof. Black or light-shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Figure 12:
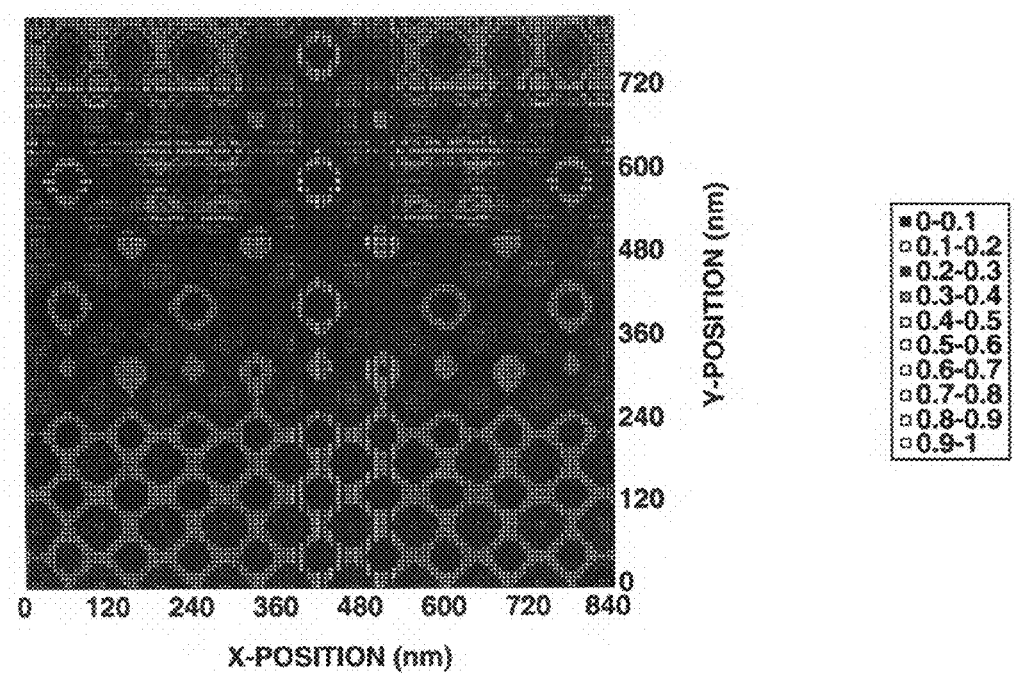
FIG. 12 is an optical image resulting from the mask of FIG. 11, printed under conditions: NA 1.3 lens, cross-pole illumination, 6% halftone phase shift mask, and azimuthally polarized illumination, showing its contrast.

Also useful is a mask in which a lattice-like light-shielding pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, heptagonal, octagonal, and polygonal shapes and even circular shape. FIG. 12 shows an optical image from the mask of FIG. 11, indicating the contrast thereof. The presence of black or light-shielded spots substantially equivalent to those of FIG. 10 indicates that holes are formed via positive/negative reversal.

Figure 13:
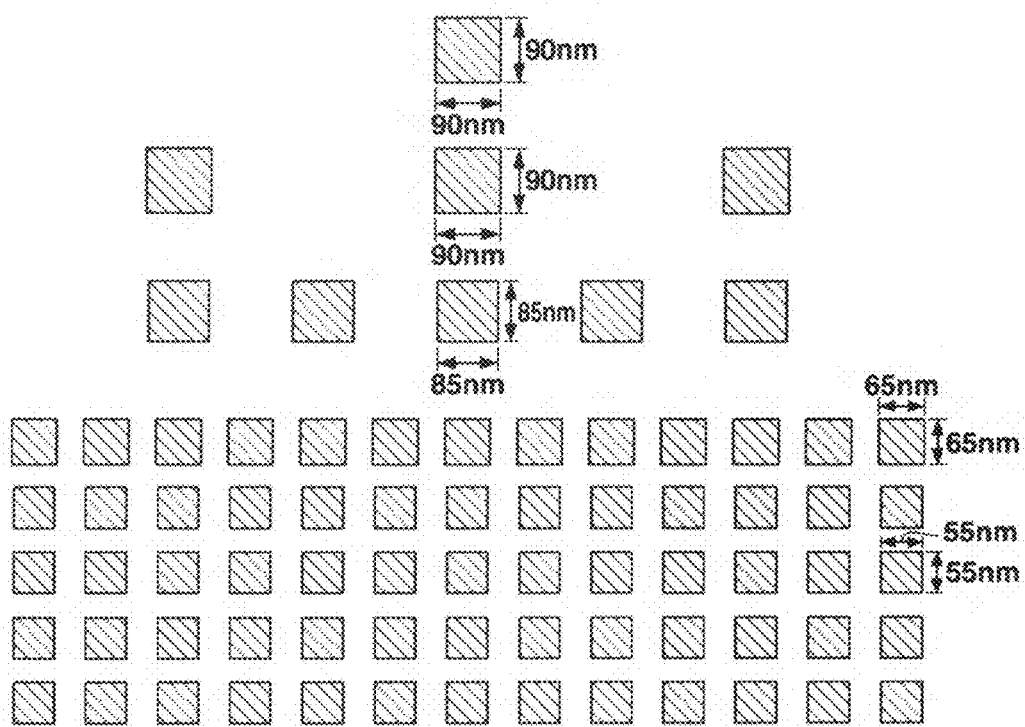
FIG. 13 illustrates a mask without a lattice-like pattern.
Figure 14:
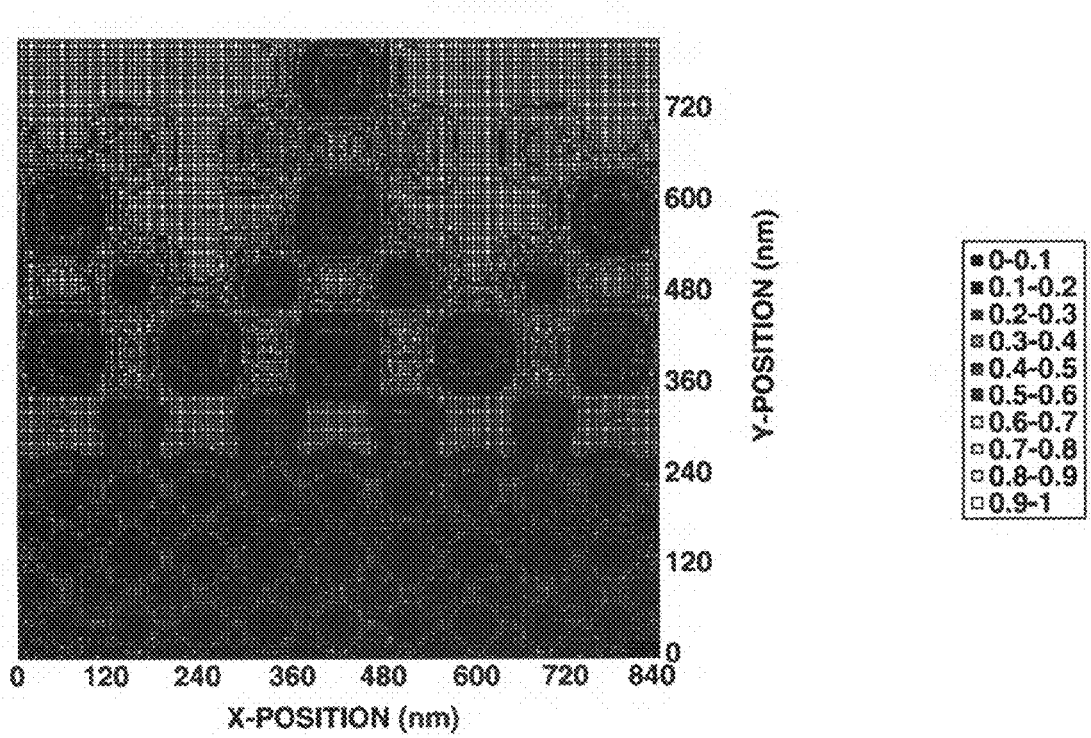
FIG. 14 is an optical image resulting from the mask of FIG. 13, printed under conditions: NA 1.3 lens, cross-pole illumination, 6% halftone phase shift mask, and azimuthally polarized illumination, showing its contrast.

On use of a mask bearing no lattice-like pattern arrayed as shown in FIG. 13, black or light-shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent.

Preparation of Resist Composition

Resist compositions in solution form (Resists 1 to 15) within the scope of the invention were prepared by dissolving components in a solvent in accordance with the recipe shown in Table 1, and filtering through a Teflon® filter with a pore size of 0.2 µm. Similarly, comparative resist compositions (Resists 16 to 18) outside the scope of the invention were prepared. Polymers 1 to 18 as base resin in Tables 1 and 2 have a structure, molecular weight (Mw) and dispersity (Mw/Mn)

as shown in Tables 3 to 5. In Tables 3 to 5, the value in parentheses indicates a molar fraction (mol %) of the relevant recurring unit.

Polymeric additives PA-1 to 3 in Tables 1 and 2 were added for providing the resist film surface with water repellency for the immersion lithography. These polymeric additives have a structure, molecular weight (Mw) and dispersity (Mw/Mn) as shown in Table 6. In Table 6, the value in parentheses indicates a molar fraction (mol %) of the relevant recurring unit.

The structure of photoacid generators PAG-1 to 4 in Tables 1 and 2 is shown in Table 7. The structure of quenchers Q-1 to 6 in Tables 1 and 2 is shown in Table 8.

TABLE 1

| Resist composition | Base resin (pbw) | Polymeric additive (pbw) | PAG (pbw) | Quencher (pbw) | Solvent (pbw) |
| --- | --- | --- | --- | --- | --- |
| Resist-1 | Polymer-1 (95) | PA-1 (5) | PAG-1 (8.7) | — | PGMEA (2,100) CyHO (900) |
| Resist-2 | Polymer-2 (95) | PA-1 (5) | PAG-2 (10.2) | — | PGMEA (2,100) CyHO (900) |
| Resist-3 | Polymer-3 (95) | PA-1 (5) | PAG-2 (5.1) | Q-5 (2.4) | PGMEA (2,700) GBL (300) |
| Resist-4 | Polymer-4 (95) | PA-1 (5) | PAG-3 (9.3) | — | PGMEA (2,100) CyHO (900) |
| Resist-5 | Polymer-5 (95) | PA-1 (5) | PAG-4 (5.5) | Q-6 (3.8) | PGMEA (2,700) GBL (300) |
| Resist-6 | Polymer-6 (95) | PA-2 (5) | PAG-3 (9.3) | — | PGMEA (2,100) CyHO (900) |
| Resist-7 | Polymer-7 (95) | PA-3 (5) | PAG-2 (7.6) | Q-1 (0.2) Q-6 (1.9) | PGMEA (2,700) GBL (300) |
| Resist-8 | Polymer-8 (95) | PA-3 (5) | PAG-2 (10.2) | — | PGMEA (2,100) CyHO (900) |
| Resist-9 | Polymer-9 (95) | PA-2 (5) | PAG-4 (11.0) | — | PGMEA (2,100) CyHO (900) |
| Resist-10 | Polymer-10 (95) | PA-2 (5) | PAG-4 (5.5) | Q-2 (0.2) Q-5 (2.4) | PGMEA (2,700) GBL (300) |
| Resist-11 | Polymer-11 (95) | PA-1 (5) | PAG-2 (10.2) | Q-3 (0.8) | PGMEA (2,100) CyHO (900) |
| Resist-12 | Polymer-12 (95) | PA-1 (5) | PAG-3 (9.3) | — | PGMEA (2,100) CyHO (900) |
| Resist-13 | Polymer-13 (95) | PA-3 (5) | PAG-4 (11.0) | Q-1 (0.4) | PGMEA (2,100) CyHO (900) |
| Resist-14 | Polymer-14 (95) | PA-3 (5) | PAG-3 (4.6) | Q-6 (2.4) | PGMEA (2,700) GBL (300) |
| Resist-15 | Polymer-15 (95) | PA-3 (5) | PAG-2 (2.5) PAG-3 (2.3) | Q-4 (0.8) | PGMEA (2,100) CyHO (900) |

TABLE 2

| Resist composition | Base resin (pbw) | Polymeric additive (pbw) | PAG (pbw) | Quencher (pbw) | Solvent (pbw) |
| --- | --- | --- | --- | --- | --- |
| Resist-16 | Polymer-16 (95) | PA-1 (5) | PAG-1 (8.7) | Q-1 (8.7) | PGMEA (2,100) CyHO (900) |
| Resist-17 | Polymer-17 (95) | PA-1 (5) | PAG-2 (5.1) | Q-5 (4.7) | PGMEA (2,700) GBL (300) |
| Resist-18 | Polymer-18 (95) | PA-2 (5) | PAG-3 (9.3) | Q-2 (1.1) | PGMEA (2,100) CyHO (900) |

TABLE 3
| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 1 | 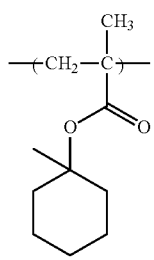 (50) | 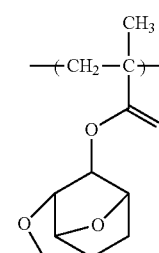 (48) | 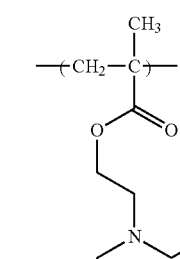 (2) | | | 9,800 | 2.0 |
| Polymer 2 | 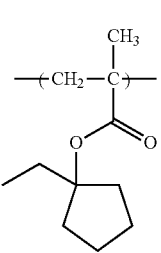 (40) | 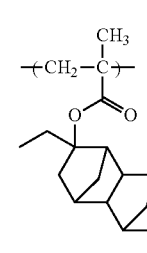 (10) | 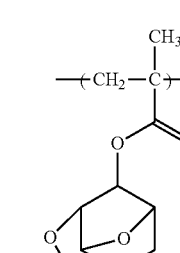 (48) | 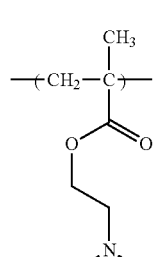 (2) | | 7,600 | 1.7 |
| Polymer 3 |  (50) | 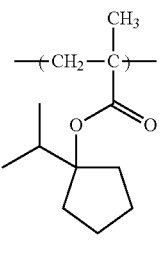 (10) | 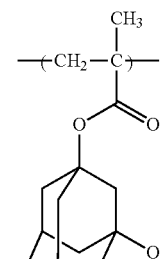 (39) | 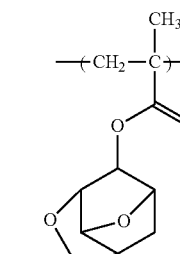 (1) | | 6,900 | 2.0 |
| Polymer 4 | 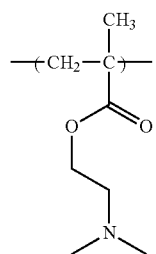 (40) |  (30) | 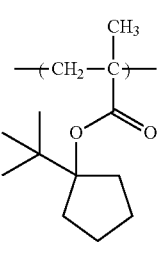 (28) | 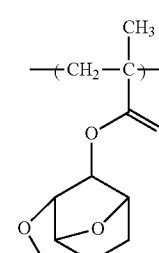 (2) | | 7,500 | 1.8 |

TABLE 3-continued

| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 5 | [1-methyladamantyl methacrylate] (45) | [3-hydroxyadamantyl methacrylate] (10) | [γ-butyrolactone methacrylate] (20.0) | [norbornane lactone methacrylate] (24.5) | [piperidinyl methacrylate] (0.5) | 8,400 | 1.7 |
| Polymer 6 | [2-adamantylpropyl methacrylate] (20) | [1-isopropylcyclohexyl methacrylate] (30) | [acetoxyadamantyl methacrylate] (10) | [oxabicyclic lactone methacrylate] (38) | [N-Boc-piperidinyl methacrylate] (2) | 8,200 | 1.9 |

TABLE 4

| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 7 | [1-tert-butylcyclopentyl methacrylate] (40) | [adamantyloxymethyl methacrylate] (15) | [oxabicyclic lactone methacrylate] (34) | [sultone methacrylate] (10) | [N-ethyl-N-Cbz-aminoethyl methacrylate] (1) | 6,700 | 2.1 |

TABLE 4-continued

| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 8 | (40) | (20) | (38) | (2) | | 7,300 | 1.9 |
| Polymer 9 | (15) | (40) | (10) | (30) | (5) | 7,900 | 1.6 |
| Polymer 10 | (45) | (38) | (15) | (2) | | 9,200 | 1.9 |
| Polymer 11 | (50) | (25) | (24) | (1) | | 7,800 | 1.9 |

TABLE 4-continued

| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 12 | (10) | (40) | (5) | (43) | (2) | 8,000 | 1.7 |

TABLE 5

| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 13 | (45) | (49) | (5) | (1) | | 6,600 | 1.8 |
| Polymer 14 | (50) | (45) | (3) | (2) | | 7,700 | 1.8 |

TABLE 5-continued

| | Constitutional units | | | | | Mw | Mw/Mn |
|---|---|---|---|---|---|---|---|
| | Unit 1 | Unit 2 | Unit 3 | Unit 4 | Unit 5 | | |
| Polymer 15 | 1-cyclohexylcyclopentyl methacrylate (50) | 3-hydroxy-1-adamantyl methacrylate (10) | 2-oxo-6,8-dioxabicyclo[3.2.1] methacrylate (29) | 2-oxo-1,3-dioxolan-4-ylmethyl methacrylate (10) | 2-(benzimidazol-1-yl)ethyl acrylate (1) | 7,600 | 1.9 |
| Polymer 16 | 1-methylcyclohexyl methacrylate (50) | 2-oxo-6,8-dioxabicyclo[3.2.1] methacrylate (50) | | | | 10,200 | 2.1 |
| Polymer 17 | 1-isopropylcyclopentyl methacrylate (50) | 3-hydroxy-1-adamantyl methacrylate (10) | 2-oxo-6,8-dioxabicyclo[3.2.1] methacrylate (40) | | | 7,100 | 1.8 |
| Polymer 18 | 1-adamantyl methacrylate (20) | 1-isopropylcyclohexyl methacrylate (30) | 3-acetoxy-1-adamantyl methacrylate (10) | 2-oxo-6,8-dioxabicyclo[3.2.1] methacrylate (40) | | 8,300 | 1.7 |

TABLE 6
| | Constitutional units | | Mw | Mw/Mn |
|---|---|---|---|---|
| | Unit 1 | Unit 2 | | |
| PA-1 | (structure) (50) | (structure) (50) | 7,200 | 2.0 |
| PA-2 | (structure) (50) | (structure) (50) | 8,100 | 1.8 |
| PA-3 | (structure) (50) | (structure) (50) | 6,900 | 1.9 |
TABLE 7
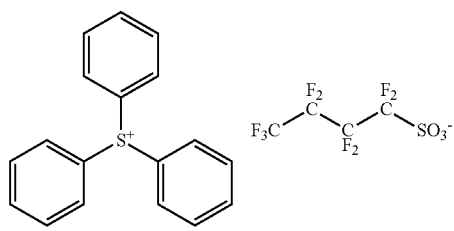
PAG-1

TABLE 7-continued
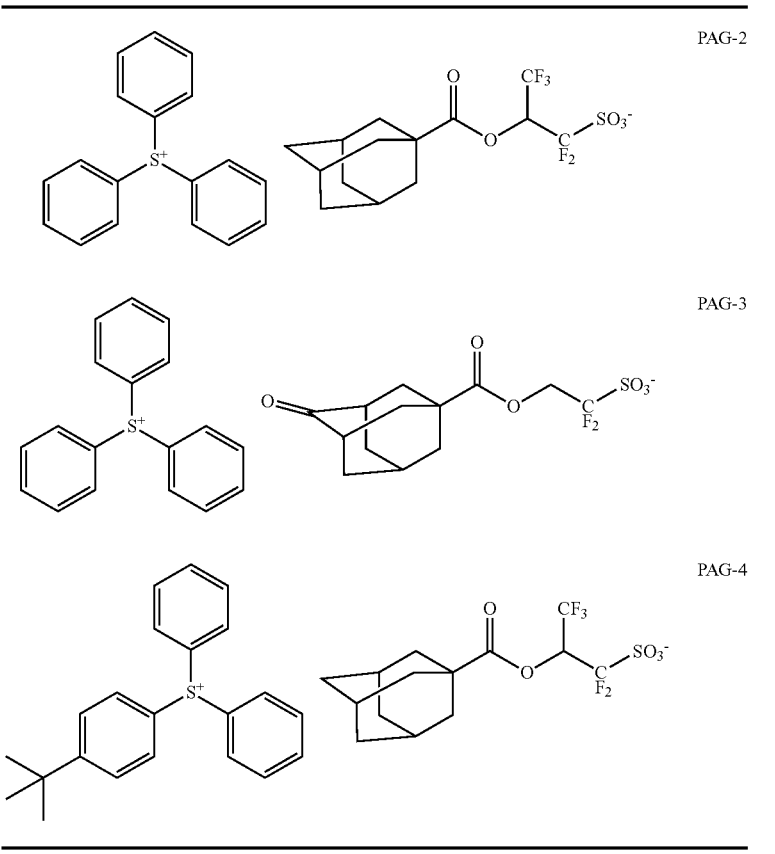
TABLE 8
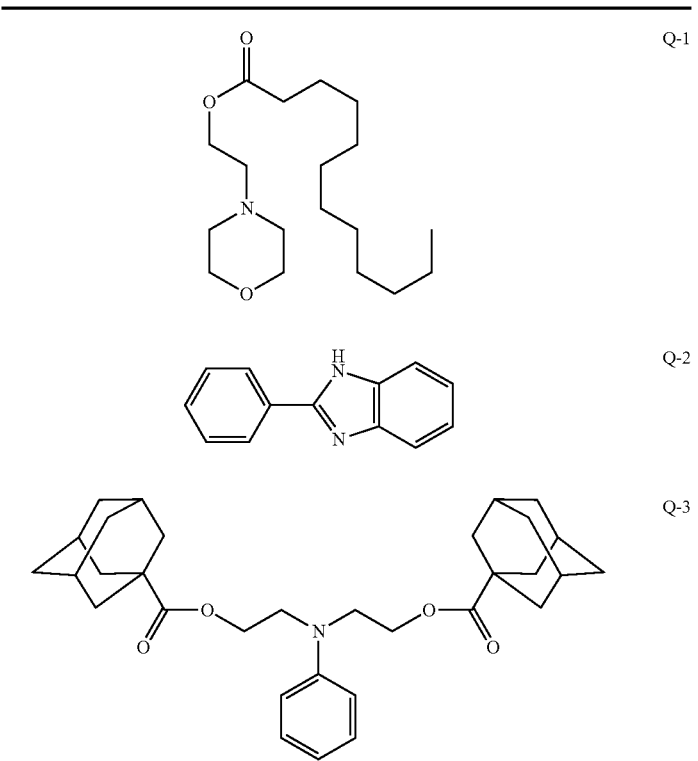

TABLE 8-continued

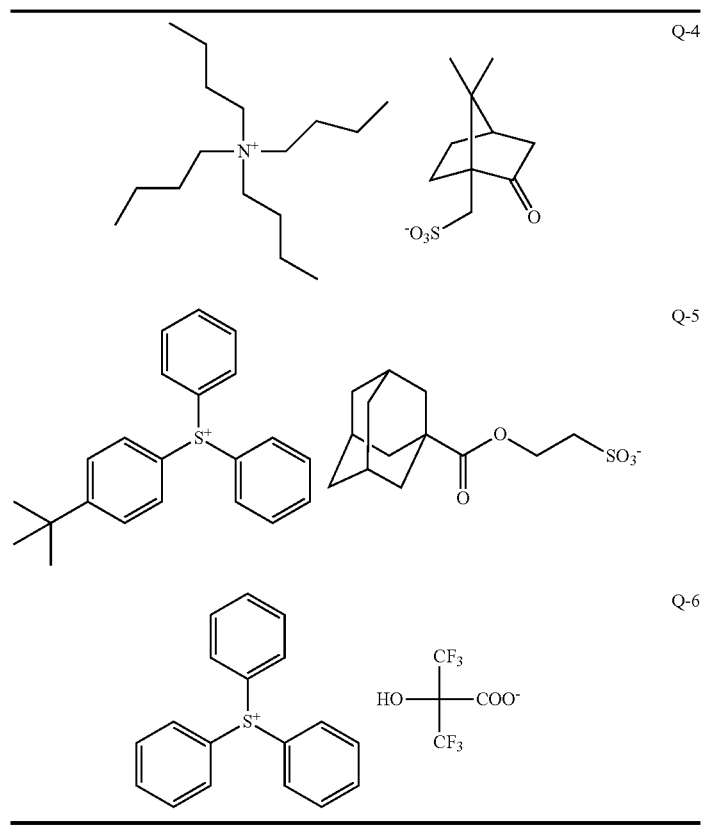

The organic solvents in Tables 1 and 2 are as follows.
PGMEA: propylene glycol monomethyl ether acetate
CyHO: cyclohexanone
GBL: γ-butyrolactone All the resist compositions in Tables 1 and 2 contained 0.1 pbw of surfactant A.

Surfactant A: 3-methyl-3-(2,2,2-trifluoroethoxymethyl)-oxetane/tetrahydrofuran/2,2-dimethyl-1,3-propanediol copolymer of the formula below (Omnova Solutions, Inc.)

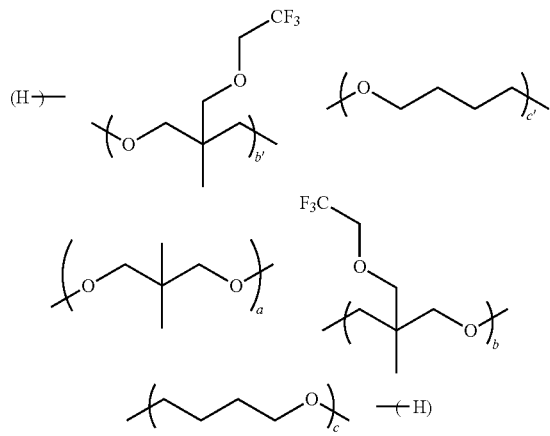

a:(b+b'):(c+c')=1:4-7:0.01-1 (molar ratio)
Mw=1,500

Examples 1 to 15 & Comparative Examples 1 to 5

Evaluation of Resist
Evaluation Method

A trilayer process substrate was prepared by forming a spin-on carbon film (ODL-50 by Shin-Etsu Chemical Co., Ltd., carbon content 80 wt %) of 200 nm thick on a silicon wafer and forming a silicon-containing spin-on hard mask (SHB-A940 by Shin-Etsu Chemical Co., Ltd., silicon content 43 wt %) of 35 nm thick thereon. The resist solution (in Tables 1 and 2) was spin coated on the trilayer process substrate, then baked (PAB) on a hot plate at 100° C. for 60 seconds to form a resist film of 90 nm thick.

Using an ArF excimer laser immersion lithography scanner (NSR-610C by Nikon Corp., NA 1.30, σ0.98/0.74, cross-pole opening 35 deg.), exposure was carried out with a varying exposure dose and focus offset value. After exposure, the resist film was baked (PEB) at an arbitrary temperature for 60 seconds, developed in an arbitrary developer for 30 seconds, and rinsed with diisoamyl ether.

The developers DS-1 to 3 used are identified below.
DS-1: butyl acetate
DS-2: 2-heptanone
DS-3: mixture of 1/1 (weight ratio) butyl acetate/methyl benzoate The mask used herein is a binary mask having an on-mask design corresponding to a 55 nm dot/90 nm pitch pattern (actual on-mask size is 4 times because of ¼ image reduction projection exposure). The hole pattern printed on the resist as a reversal pattern was observed under an electron microscope. The optimum dose (Eop) was the dose (mJ/cm$^2$) that gave a hole inner diameter of 50 nm. The cross-sectional profile of the pattern formed at the optimum dose was observed under an electron microscope and judged passed or rejected according to the following criterion.

Passed: pattern of perpendicular sidewall; acceptable profile

Rejected: T-top profile with surface layer substantially clogged or inversely tapered profile of pattern with graded sidewall (greater line width nearer to surface layer); unacceptable profile A focus range where a hole pattern could be resolved at the optimum dose was determined and reported as depth of focus (DOF, m). A larger value of DOF indicates a wider permissible margin for focus offset and is preferable.

In a comparative run, some resist compositions were processed as in the above organic solvent negative development until the exposure and PEB steps. This was followed by positive development using an aqueous solution of 2.38 wt % tetramethylammonium hydroxide (TMAH) as the developer. The mask used herein is a binary mask having an on-mask design corresponding to a 55 nm hole/90 nm pitch pattern (actual on-mask size is 4 times because of 1/4 image reduction projection exposure). The hole pattern printed on the resist was observed under an electron microscope. The pattern profile and DOF were evaluated in accordance with the same criteria as in the organic solvent negative development.

Evaluation Results

The test results of the resist compositions in Table 1 are shown in Table 9 together with the conditions (PEB temperature and developer) under which they are evaluated. The test results of the comparative resist compositions in Table 2 are shown in Table 10 together with the conditions (PEB temperature and developer) under which they are evaluated. Table 10 also tabulates the test results of TMAH positive development in the comparative run.

TABLE 9

| | Resist composition | PEB temp. (° C.) | Developer | Eop (mJ/cm$^2$) | Profile | DOF (nm) |
|---|---|---|---|---|---|---|
| Example 1 | Resist-1 | 100 | DS-1 | 44 | Passed | 140 |
| Example 2 | Resist-2 | 100 | DS-2 | 45 | Passed | 120 |
| Example 3 | Resist-3 | 95 | DS-3 | 43 | Passed | 160 |
| Example 4 | Resist-4 | 90 | DS-1 | 38 | Passed | 180 |
| Example 5 | Resist-5 | 105 | DS-1 | 42 | Passed | 120 |
| Example 6 | Resist-6 | 100 | DS-1 | 40 | Passed | 120 |
| Example 7 | Resist-7 | 90 | DS-1 | 39 | Passed | 160 |
| Example 8 | Resist-8 | 90 | DS-1 | 37 | Passed | 180 |
| Example 9 | Resist-9 | 100 | DS-1 | 48 | Passed | 140 |
| Example 10 | Resist-10 | 100 | DS-1 | 44 | Passed | 120 |
| Example 11 | Resist-11 | 95 | DS-1 | 38 | Passed | 140 |
| Example 12 | Resist-12 | 100 | DS-1 | 39 | Passed | 120 |
| Example 13 | Resist-13 | 90 | DS-1 | 35 | Passed | 160 |
| Example 14 | Resist-14 | 90 | DS-1 | 28 | Passed | 160 |
| Example 15 | Resist-15 | 85 | DS-1 | 40 | Passed | 140 |

TABLE 10

| | Resist composition | PEB temp. (° C.) | Developer | Eop (mJ/cm$^2$) | Profile | DOF (nm) |
|---|---|---|---|---|---|---|
| Comparative Example 1 | Resist-16 | 100 | DS-1 | 43 | Rejected | 40 |
| Comparative Example 2 | Resist-17 | 95 | DS-3 | 42 | Rejected | 80 |
| Comparative Example 3 | Resist-18 | 100 | DS-1 | 41 | Rejected | 60 |
| Comparative Example 4 | Resist-1 | 100 | TMAH | 48 | Rejected | 20 |
| Comparative Example 5 | Resist-3 | 95 | TMAH | 46 | Rejected | 20 |

It has been demonstrated from the data in Tables 9 and 10 that by subjecting a resist composition comprising a polymer of specific structure, a PAG and an organic solvent to organic solvent negative development, a pattern having a good profile and wide DOF is formed.

While the invention has been described with reference to a preferred embodiment, it will be understood by those skilled in the art that various changes may be made without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2011-251229 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
applying a resist composition onto a substrate, the resist composition comprising
(A) a polymer comprising
recurring units (a1) having a carboxyl group protected with an acid labile group and
recurring units (a2) selected from the group consisting of the following formulae:

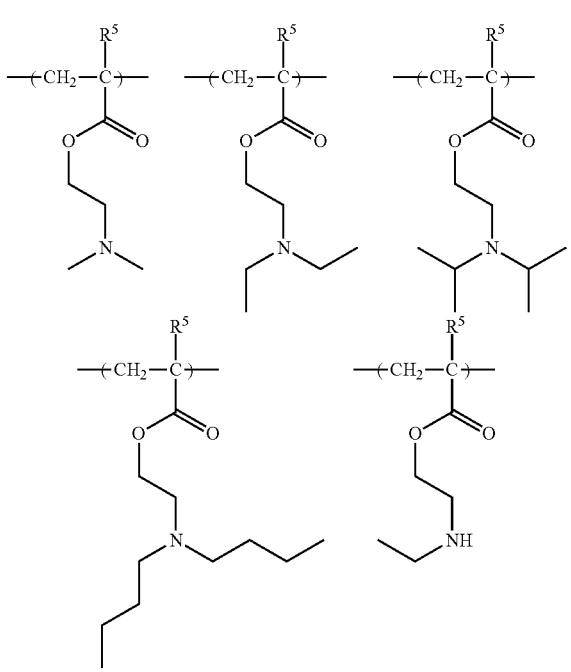

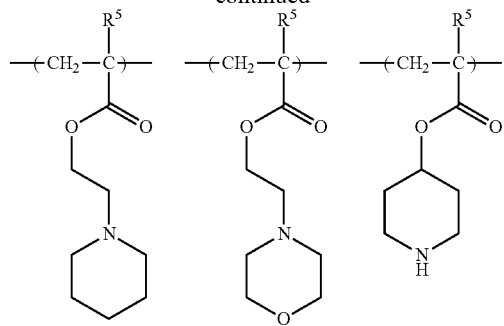
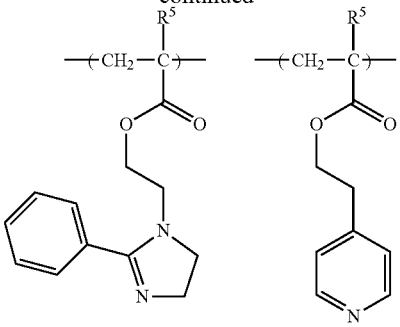
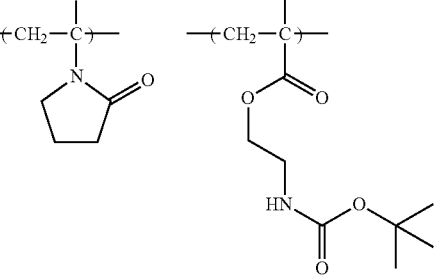

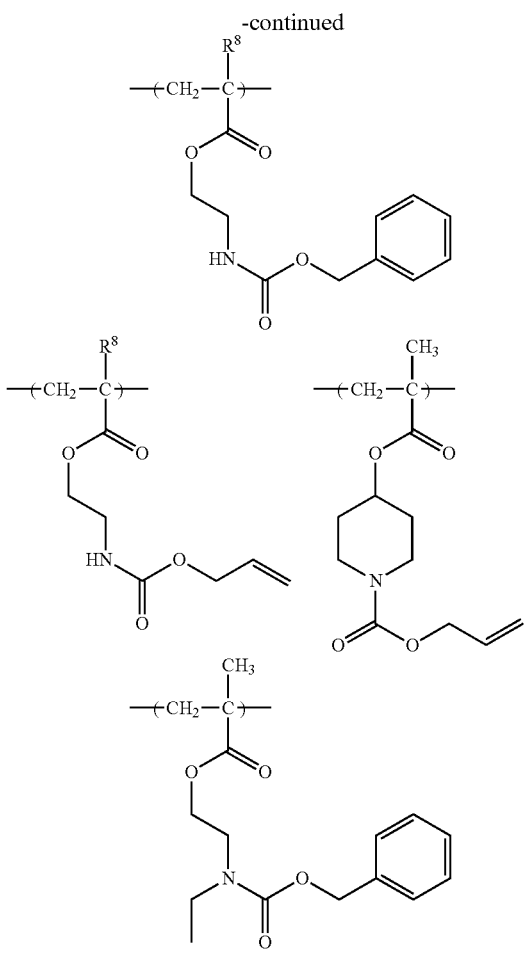

wherein $R^5$ and $R^8$ are hydrogen or methyl,
(B) a photoacid generator, and
(C) an organic solvent,
prebaking the composition to form a resist film,
exposing the resist film to high-energy radiation,
baking, and
selectively dissolving an unexposed region of the resist film in an organic solvent-based developer to form a negative pattern.

2. The process of claim 1 wherein in polymer (A), the recurring units (a1) having a carboxyl group protected with an acid labile group have the general formula (1):

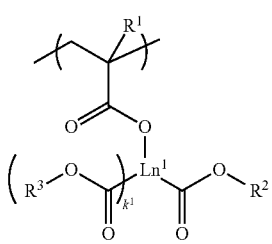

wherein $R^1$ is each independently hydrogen or methyl, $R^2$ and $R^3$ each are an acid labile group, $k^1$ is 0 or 1, $Ln^1$ is a single bond or a divalent, straight, branched or cyclic $C_1$-$C_{12}$ hydrocarbon group which may contain a heteroatom in case of $k^1$=0, and $Ln^1$ is a trivalent, straight, branched or cyclic $C_1$-$C_{12}$ hydrocarbon group which may contain a heteroatom in case of $k^1$=1.

3. The process of claim 2 wherein either one or both of acid labile groups $R^2$ and $R^3$ in formula (1) have the general formula (2):

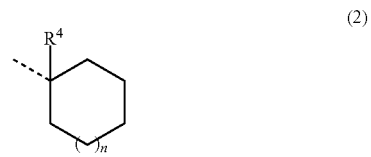

wherein the broken line denotes a valence bond, $R^4$ is a straight, branched or cyclic $C_1$-$C_6$ alkyl group, and n is 0 or 1.

4. The process of claim 1 wherein polymer (A) further comprises recurring units having a polar functional group selected from the group consisting of hydroxyl, carboxyl, cyano, carbonyl, ether, ester, carbonic acid ester, and sulfonic acid ester, as an adhesive group.

5. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate,
the at least one organic solvent being present in a total amount of at least 60% by weight of the developer.

6. The process of claim 1 wherein the step of exposing the resist film to high-energy radiation includes ArF excimer laser immersion lithography of 193 nm wavelength or EUV lithography of 13.5 nm wavelength.

7. The process of claim 1 wherein in polymer (A), the recurring units (a1) having a carboxyl group protected with an acid labile group have the following general formula (10):

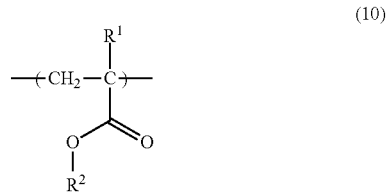

wherein $R^1$ is hydrogen or methyl, and $R^2$ is an acid labile group.

8. A pattern forming process comprising the steps of:
applying a resist composition onto a substrate, the resist composition comprising
(A) a polymer consisting of
recurring units (a1) having a carboxyl group protected with an acid labile group and recurring units (a2) selected from the group consisting of the following formulae:
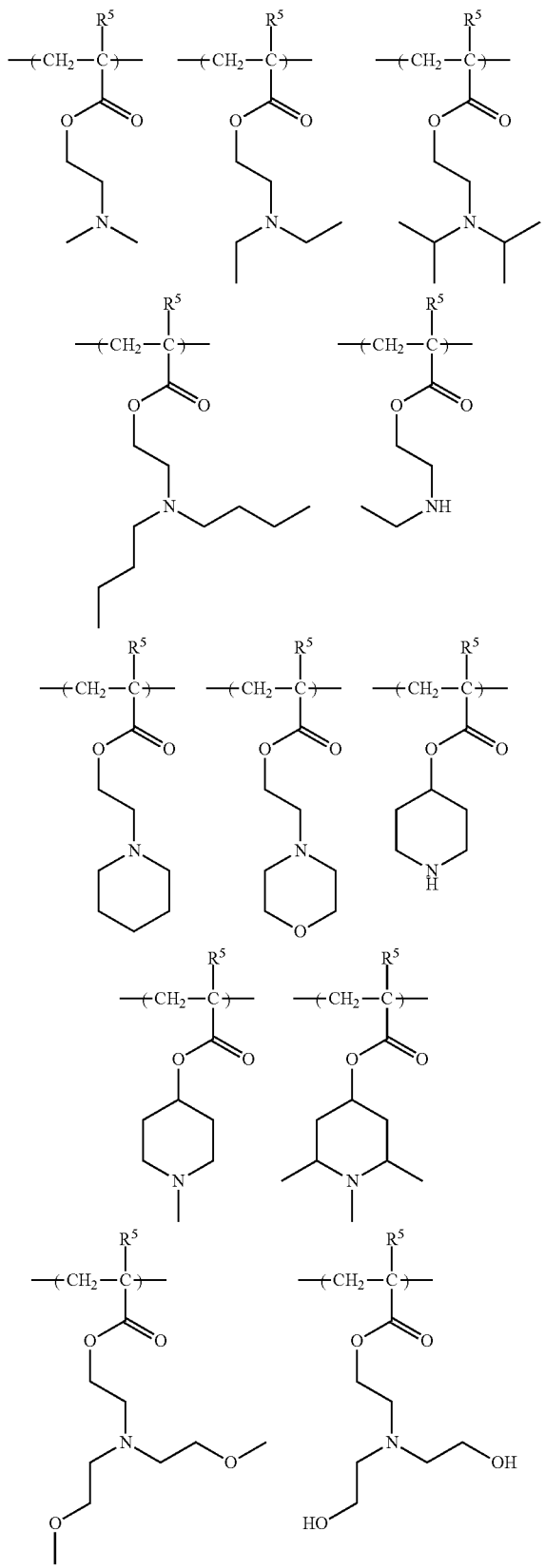
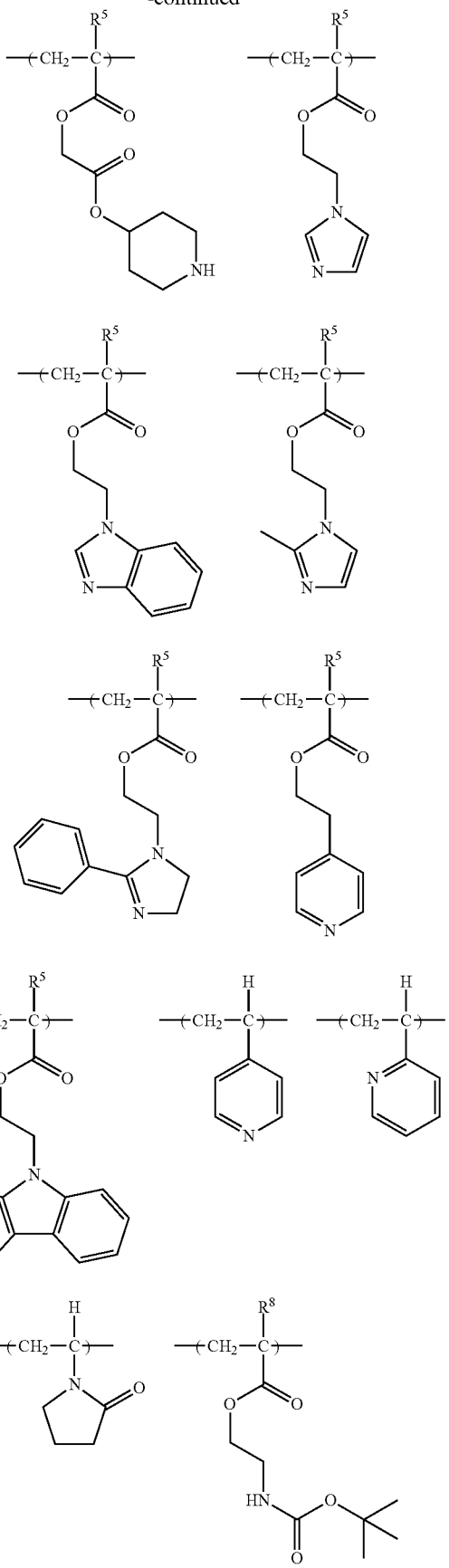

-continued

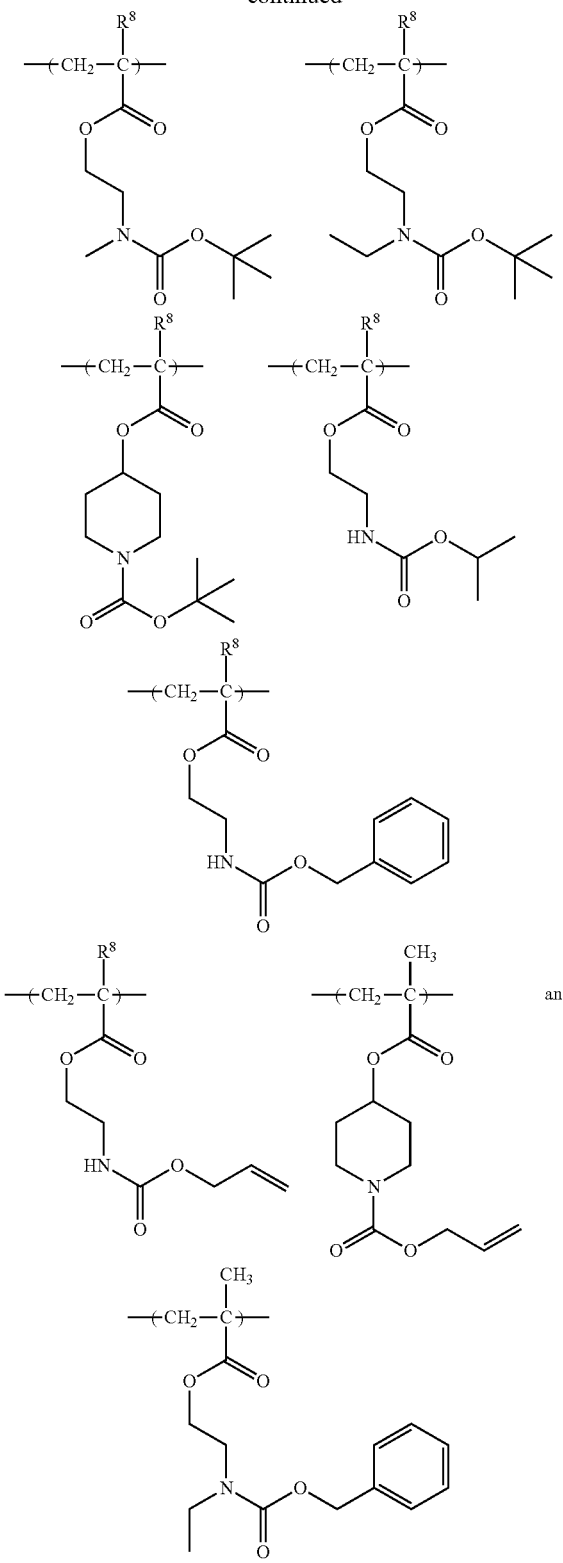

wherein $R^5$ and $R^8$ are hydrogen or methyl, and recurring units having a polar functional group selected from the group consisting of hydroxyl, carboxyl, cyano, carbonyl, ether, ester, carbonic acid ester, and sulfonic acid ester, as an adhesive group, (B) a photoacid generator, and (C) an organic solvent, prebaking the composition to form a resist film, exposing the resist film to high-energy radiation, baking, and selectively dissolving an unexposed region of the resist film in an organic solvent-based developer to form a negative pattern.

9. A pattern forming process comprising the steps of:

applying a resist composition onto a substrate, the resist composition comprising (A) a polymer consisting of recurring units (a1) having a carboxyl group protected with an acid labile group, recurring units (a2) having the general formula (3) or (4):

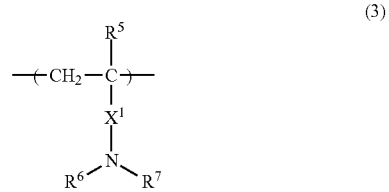

(3)

wherein $R^5$ is hydrogen or methyl, $X^1$ is a single bond or a divalent, straight, branched or cyclic $C_1$-$C_{15}$ hydrocarbon group which may contain an oxygen atom, $R^6$ and $R^7$ are each independently hydrogen or a monovalent, straight, branched or cyclic $C_1$-$C_{15}$ hydrocarbon group which may contain a heteroatom and in which one or more hydrogen atoms may be substituted by fluorine atoms, or $R^6$ and $R^7$ may bond together to form a ring with the nitrogen atom to which they are attached, or either one or both of $R^6$ and $R^7$ may bond with $X^1$ to form a ring with the nitrogen atom to which they are attached,

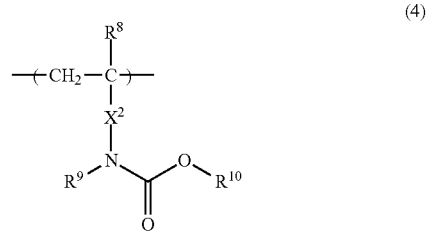

(4)

wherein $R^8$ is hydrogen or methyl, $X^2$ is a single bond or a divalent, straight, branched or cyclic $C_1$-$C_{15}$ hydrocarbon group which may contain an oxygen atom, $R^9$ is hydrogen or a monovalent, straight, branched or cyclic $C_1$-$C_{15}$ hydrocarbon group which may contain a heteroatom and in which one or more hydrogen atoms may be substituted by fluorine atoms, or $R^9$ may bond with $X^2$ to form a ring with the nitrogen atom to which they are attached, and $R^{10}$ is a monovalent $C_3$-$C_{15}$ hydrocarbon group which may contain a heteroatom, recurring units having a polar functional group selected from the group consisting of hydroxyl, carboxyl, cyano, carbonyl, ether, ester, carbonic acid ester, and sulfonic acid ester, as an adhesive group, and recurring units having the general formula (p1), (p2) or (p3):

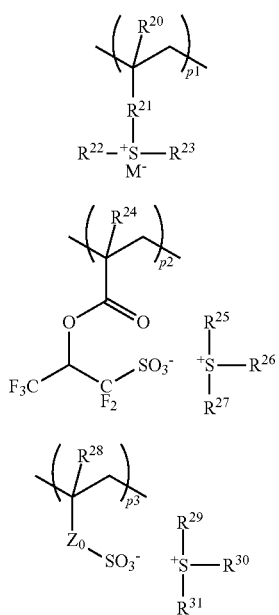

(p1)

(p2)

(p3)

wherein $R^{20}$, $R^{24}$ and $R^{28}$ each are hydrogen or methyl, $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene group or phenylene group, which may contain a carbonyl (—CO—), ester (—COO—), ether (—O—) or hydroxyl radical, $R^{22}$, $R^{23}$, $R^{25}$, $R^{26}$, $R^{27}$, $R^{29}$, $R^{30}$ and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z_0$ is a single bond, methylene, ethylene, phenylene, fluorophenylene, —O—$R^{32}$—, or —C(=O)—$Z_1$—$R^{32}$—wherein $Z_1$ is oxygen or NH, and $R^{32}$ is a straight, branched or cyclic $C_1$-$C_6$ alkylene group, alkenylene group or phenylene group, which may contain a carbonyl, ester, ether or hydroxyl radical, and M⁻ is a non-nucleophilic counter ion, and (C) an organic solvent, prebaking the composition to form a resist film, exposing the resist film to high-energy radiation, baking, and selectively dissolving an unexposed region of the resist film in an organic solvent-based developer to form a negative pattern.

10. The process of claim 8 wherein in polymer (A), the recurring units (a1) having a carboxyl group protected with an acid labile group have the general formula (1) or (10):

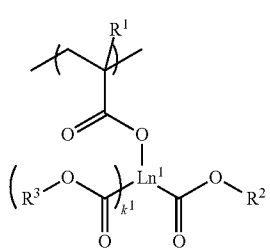

(1)

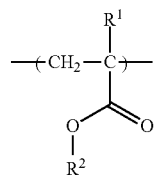

(10)

wherein $R^1$ is each independently hydrogen or methyl, $R^2$ and $R^3$ each are an acid labile group, $k^1$ is 0 or 1, $Ln^1$ is a single bond or a divalent, straight, branched or cyclic $C_1$-$C_{12}$ hydrocarbon group which may contain a heteroatom in case of $k^1$=0, and $Ln^1$ is a trivalent, straight, branched or cyclic $C_1$-$C_{12}$ hydrocarbon group which may contain a heteroatom in case of $k^1$=1.

11. The process of claim 9 wherein in polymer (A), the recurring units (a1) having a carboxyl group protected with an acid labile group have the general formula (1) or (10):

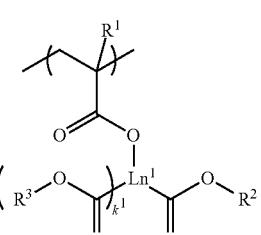

(1)

(10)

wherein $R^1$ is each independently hydrogen or methyl, $R^2$ and $R^3$ each are an acid labile group, $k^1$ is 0 or 1, $Ln^1$ is a single bond or a divalent, straight, branched or cyclic $C_1$-$C_{12}$ hydrocarbon group which may contain a heteroatom in case of $k^1$=0, and $Ln^1$ is a trivalent, straight, branched or cyclic $C_1$-$C_{12}$ hydrocarbon group which may contain a heteroatom in case of $k^1$=1.

12. The process of claim 10 wherein either one or both of acid labile groups $R^2$ and $R^3$ in formula (1) have the general formula (2):

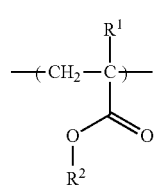

(2)

wherein the broken line denotes a valence bond, $R^4$ is a straight, branched or cyclic $C_1$-$C_6$ alkyl group, and n is 0 or 1.

13. The process of claim 11 wherein either one or both of acid labile groups $R^2$ and $R^3$ in formula (1) have the general formula (2):

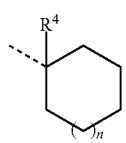

(2)
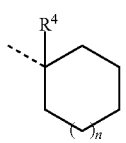
wherein the broken line denotes a valence bond, R⁴ is a straight, branched or cyclic $C_1$-$C_6$ alkyl group, and n is 0 or 1.
14. The process of claim 9 wherein in polymer (A), the recurring units (a2) is at least one selected from the group consisting of the following formulae:
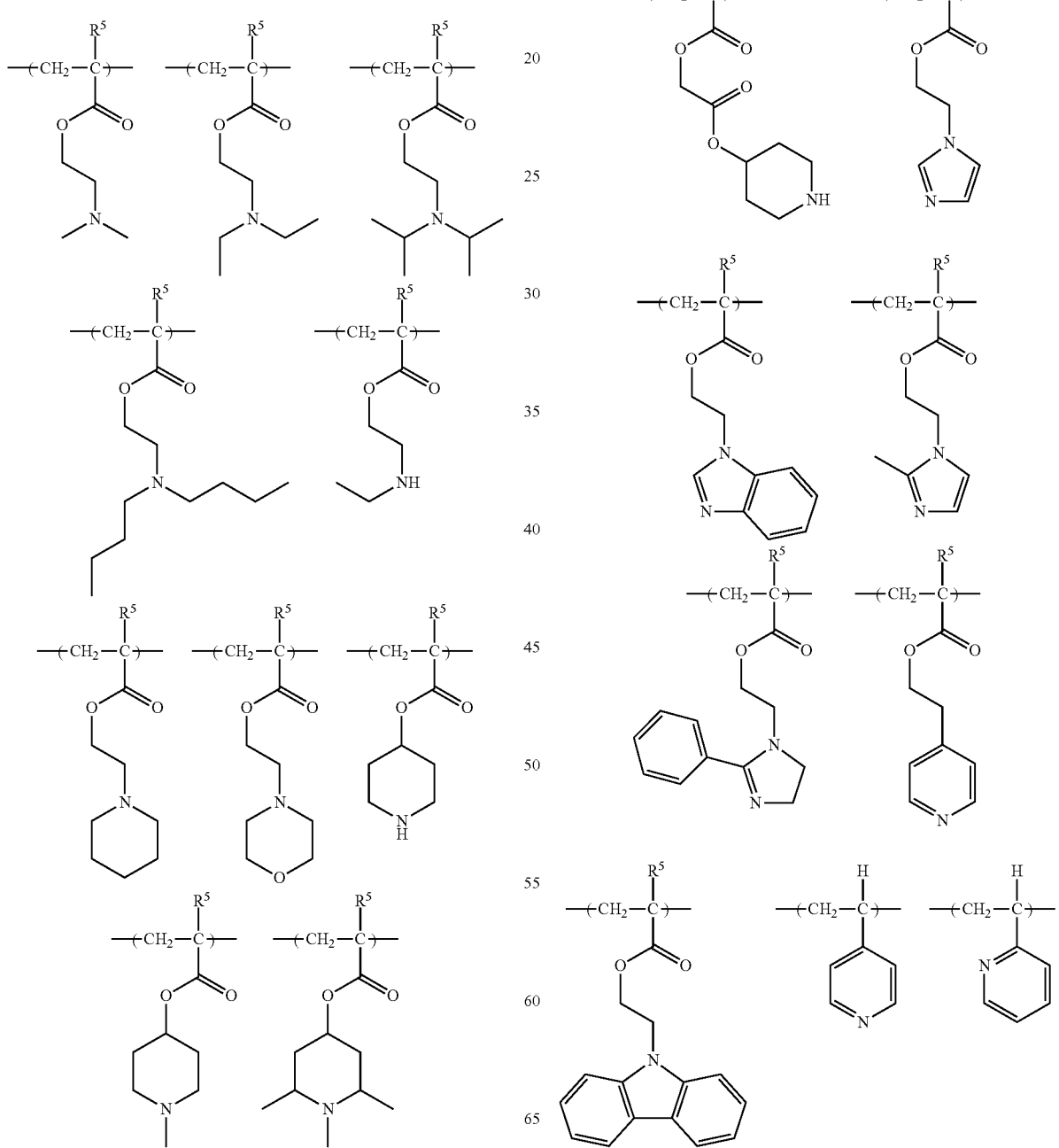

-continued
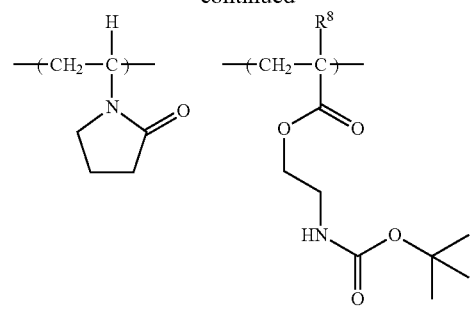
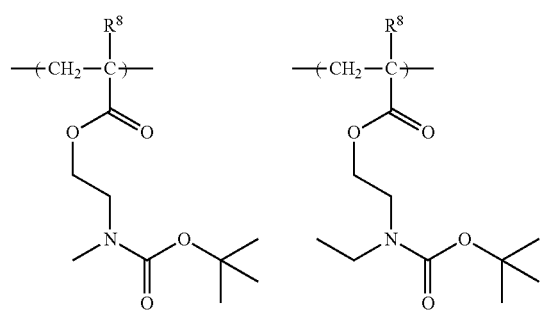
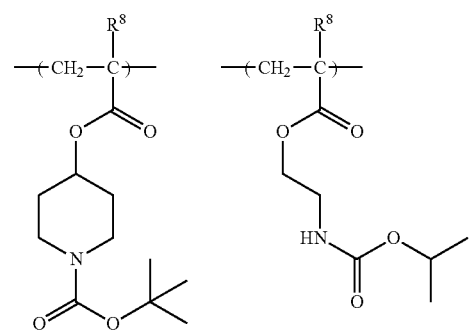
-continued
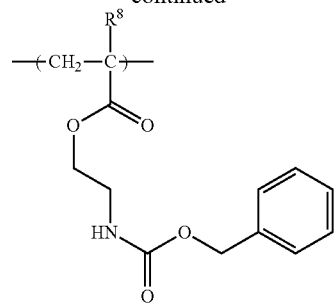
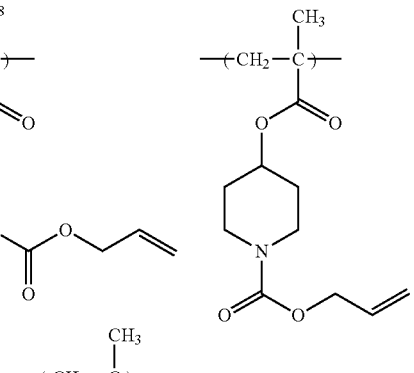
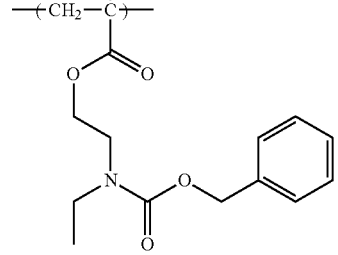
and
wherein $R^5$ and $R^8$ are hydrogen or methyl.
15. The process of claim 9 wherein the resist composition further comprises (B) a photoacid generator.
* * * * *